US012293723B2

(12) United States Patent
Feng et al.

(10) Patent No.: US 12,293,723 B2
(45) Date of Patent: *May 6, 2025

(54) SHIFT REGISTER UNIT, GATE DRIVING CIRCUIT, DISPLAY DEVICE, AND DRIVING METHOD

(71) Applicants: Hefei Xinsheng Optoelectronics Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/444,926

(22) Filed: Feb. 19, 2024

(65) Prior Publication Data
US 2024/0194149 A1    Jun. 13, 2024

Related U.S. Application Data

(63) Continuation of application No. 17/838,419, filed on Jun. 13, 2022, now Pat. No. 11,942,041, which is a (Continued)

(30) Foreign Application Priority Data

Jul. 18, 2018   (CN) .......................... 201810792891.7

(51) Int. Cl.
*G09G 3/3266* (2016.01)
*G11C 19/28* (2006.01)

(52) U.S. Cl.
CPC .......... *G09G 3/3266* (2013.01); *G11C 19/28* (2013.01); *G09G 2300/0426* (2013.01);
(Continued)

(58) Field of Classification Search
CPC ............... G09G 3/2092; G09G 3/3266; G09G 3/3674–3681; G09G 2300/0809;
(Continued)

(56) References Cited

U.S. PATENT DOCUMENTS 8,253,651 B2   8/2012   Pai
10,978,114 B2   4/2021   Wang
(Continued)

FOREIGN PATENT DOCUMENTS

CN    103050106 A    4/2013
CN    203910234 U    10/2014
(Continued)

OTHER PUBLICATIONS

Oct. 15, 2019—(CN) International Search Report Appn PCT/CN2019/096185.
(Continued)

*Primary Examiner* — Nathan Danielsen
(74) *Attorney, Agent, or Firm* — Banner & Witcoff, Ltd.

(57) ABSTRACT

A shift register unit, a gate driving circuit, a display device, and a driving method are disclosed. The shift register unit includes a first transmission circuit and a first input-output unit. The first transmission circuit is electrically connected to a blanking pull-up node and a first pull-up node. The first input-output unit includes an output circuit, a first pull-down control circuit, and a first pull-down auxiliary control circuit.

20 Claims, 16 Drawing Sheets

Related U.S. Application Data continuation-in-part of application No. 17/355,621, filed on Jun. 23, 2021, now Pat. No. 11,403,990, which is a continuation-in-part of application No. 16/633,370, filed as application No. PCT/CN2019/096185 on Jul. 16, 2019, now Pat. No. 11,069,281.

(52) U.S. Cl.
CPC .............. *G09G 2310/0286* (2013.01); *G09G 2310/061* (2013.01); *G09G 2310/08* (2013.01)

(58) Field of Classification Search
CPC .......................... G09G 2310/02–0221; G09G 2310/0243–0251; G09G 2310/0267; G09G 2310/0278; G09G 2310/0286; G09G 2310/061
See application file for complete search history.

(56) References Cited

U.S. PATENT DOCUMENTS

| | | |
|---|---|---|
| 2006/0139293 A1 | 6/2006 | Cho |
| 2010/0245301 A1 | 9/2010 | Shang |
| 2013/0241812 A1 | 9/2013 | Fujikawa |
| 2015/0317954 A1 | 11/2015 | Jang |
| 2017/0186373 A1 | 6/2017 | Nishikawa et al. |
| 2018/0190180 A1 | 7/2018 | Shang et al. |
| 2018/0268755 A1 | 9/2018 | Chen |
| 2018/0337682 A1 | 11/2018 | Takasugi et al. |
| 2019/0088184 A1 | 3/2019 | Morein |
| 2019/0139494 A1 | 5/2019 | Zeng et al. |
| 2021/0201814 A1 | 7/2021 | Choi |

FOREIGN PATENT DOCUMENTS

| | | |
|---|---|---|
| CN | 205595037 U | 9/2016 |
| CN | 108281123 A | 7/2018 |
| CN | 109935199 A | 6/2019 |
| KR | 20050054333 A | 6/2005 |
| KR | 20170078978 A | 7/2017 |
| WO | 2015190407 A1 | 12/2015 |

OTHER PUBLICATIONS

Oct. 16, 2019—(CN) Written Opinion Appn PCT/CN2019/096185.
Dec. 8, 2021—(US) Non-Final Office Action U.S. Appl. No. 17/355,621.
Mar. 22, 2021—(US) Notice of Allowance U.S. Appl. No. 16/633,370.
Nov. 10, 2022—(US) Office Action U.S. Appl. No. 17/838,419.
Nov. 10, 2022—(US) Office Action U.S. Appl. No. 17/842,507.
Feb. 16, 2022—(EP) Partial Supplementary European Search Report Appn 19837136.1.
Apr. 4, 2022(US) Notice of Allowance U.S. Appl. No. 17/355,621.
Apr. 27, 2023—(US) Office Action U.S. Appl. No. 17/838,419.
Nov. 27, 2023—(US) Notice of Allowance U.S. Appl. No. 17/838,419.
Sep. 14, 2023—(US) Office Action U.S. Appl. No. 17/838,419.
Sep. 28, 2023—(US) Non-Final Office Action U.S. Appl. No. 18/173,190.
Jan. 18, 2024—(US) Corrected Notice of Allowability U.S. Appl. No. 17/838,419.

SHIFT REGISTER UNIT, GATE DRIVING CIRCUIT, DISPLAY DEVICE, AND DRIVING METHOD

CROSS-REFERENCE TO RELATED APPLICATIONS

This application is a continuation of U.S. patent application Ser. No. 17/838,419 filed on Jun. 13, 2022, which is a continuation-in-part of U.S. patent application Ser. No. 17/355,621 filed on Jun. 23, 2021, which is a continuation-in-part of U.S. patent application Ser. No. 16/633,370 filed on Jan. 23, 2020, which is a U.S. National Phase Entry of International Application No. PCT/CN2019/096185 filed on Jul. 16, 2019, which claims priority to and the benefit of Chinese patent application No. 201810792891.7 filed on Jul. 18, 2018. The above-identified applications are incorporated by reference herein in their entirety.

TECHNICAL FIELD

Embodiments of the present disclosure relate to a shift register unit, a gate driving circuit, a display device, and a driving method.

BACKGROUND

Currently in the display field, especially in an OLED (organic light-emitting diode) display panel, a gate driving circuit is generally integrated in a GATE IC. The area of a chip in IC design is a main factor affecting the cost of the chip, and technology developers need to focus on how to effectively reduce the area of the chip.

SUMMARY

At least an embodiment of the present disclosure provides a shift register unit, comprising a blanking unit, a first transmission circuit, a second transmission circuit, a first input-output unit, and a second input-output unit. The blanking unit is configured to charge a pull-up control node in response to a compensation selection control signal and input a blanking pull-up signal to a blanking pull-up node; the first input-output unit comprises a first pull-up node and a first output terminal, and the second input-output unit comprises a second pull-up node and a second output terminal; the first transmission circuit is electrically connected to the blanking pull-up node and the first pull-up node, and is configured to charge the first pull-up node, by using the blanking pull-up signal, in response to a first transmission signal; the second transmission circuit is electrically connected to the blanking pull-up node and the second pull-up node, and is configured to charge the second pull-up node, by using the blanking pull-up signal, in response to a second transmission signal; the first input-output unit is configured to charge the first pull-up node in response to a first display input signal, and is configured to output a composite output signal to the first output terminal under control of a level of the first pull-up node; and the second input-output unit is configured to charge the second pull-up node in response to a second display input signal, and is configured to output the composite output signal to the second output terminal under control of a level of the second pull-up node.

For example, in the shift register unit provided by an embodiment of the present disclosure, the blanking unit comprises a blanking input circuit and a blanking pull-up circuit; the blanking input circuit is configured to charge the pull-up control node in response to the compensation selection control signal, and to maintain a level of the pull-up control node; and the blanking pull-up circuit is configured to input the blanking pull-up signal to the blanking pull-up node under control of the level of the pull-up control node.

For example, in the shift register unit provided by an embodiment of the present disclosure, the blanking unit further comprises a blanking coupling circuit, the blanking coupling circuit is electrically connected to the pull-up control node, and is configured to pull-up, by coupling, the level of the pull-up control node.

For example, in the shift register unit provided by an embodiment of the present disclosure, the blanking input circuit comprises a first transistor and a first capacitor; a gate electrode of the first transistor is connected to a compensation selection control terminal to receive the compensation selection control signal, a first electrode of the first transistor is connected to a blanking input signal terminal, and a second electrode of the first transistor is connected to the pull-up control node; and a first electrode of the first capacitor is connected to the pull-up control node, and a second electrode of the first capacitor is connected to a first voltage terminal.

For example, in the shift register unit provided by an embodiment of the present disclosure, the blanking pull-up circuit comprises a second transistor, a gate electrode of the second transistor is connected to the pull-up control node, a first electrode of the second transistor is connected to a second voltage terminal to receive a second voltage, and a second electrode of the second transistor is connected to the blanking pull-up node.

For example, in the shift register unit provided by an embodiment of the present disclosure, the blanking coupling circuit comprises a coupling capacitor and a third transistor, a gate electrode of the third transistor is connected to the pull-up control node, a first electrode of the third transistor is connected to a second voltage terminal to receive a second voltage, and a second electrode of the third transistor is connected to a first electrode of the coupling capacitor, and a second electrode of the coupling capacitor is connected to the pull-up control node.

For example, in the shift register unit provided by an embodiment of the present disclosure, the first transmission circuit comprises a first transmission transistor, a gate electrode of the first transmission transistor is connected to a first transmission signal terminal to receive the first transmission signal, and a first electrode of the first transmission transistor is connected to the blanking pull-up node to receive the blanking pull-up signal, and a second electrode of the first transmission transistor is connected to the first pull-up node.

For example, in the shift register unit provided by an embodiment of the present disclosure, the first transmission signal terminal comprises a first clock signal terminal, and the first transmission signal comprises a first clock signal received by the first clock signal terminal.

For example, in the shift register unit provided by an embodiment of the present disclosure, the second transmission circuit comprises a second transmission transistor, a gate electrode of the second transmission transistor is connected to a second transmission signal terminal to receive the second transmission signal, a first electrode of the second transmission transistor is connected to the blanking pull-up node to receive the blanking pull-up signal, and a second electrode of the second transmission transistor is connected to the second pull-up node.

For example, in the shift register unit provided by an embodiment of the present disclosure, the second transmission signal terminal comprises a first clock signal terminal, and the second transmission signal comprises a first clock signal received by the first clock signal terminal.

For example, in the shift register unit provided by an embodiment of the present disclosure, the first input-output unit comprises a display input circuit, an output circuit, a first pull-down control circuit, and a pull-down circuit; the first output terminal comprises a shift signal output terminal and a pixel scanning signal output terminal, and the shift signal output terminal and the pixel scanning signal output terminal output the composite output signal; the display input circuit is configured to charge the first pull-up node in response to the first display input signal; the output circuit is configured to output the composite output signal to the first output terminal under control of the level of the first pull-up node; the first pull-down control circuit is configured to control a level of a pull-down node under control of the level of the first pull-up node; and the pull-down circuit is configured to pull down and reset the first pull-up node, the shift signal output terminal, and the pixel scanning signal output terminal under control of the level of the pull-down node.

For example, in the shift register unit provided by an embodiment of the present disclosure, the display input circuit comprises a fourth transistor, a gate electrode of the fourth transistor is connected to a display input signal terminal to receive the first display input signal, a first electrode of the fourth transistor is connected to a second voltage terminal to receive a second voltage, and a second electrode of the fourth transistor is connected to the first pull-up node; the output circuit comprises a fifth transistor and a sixth transistor, a gate electrode of the fifth transistor is connected to the first pull-up node, a first electrode of the fifth transistor is connected to a second clock signal terminal to receive a second clock signal and the second clock signal is used as the composite output signal, and a second electrode of the fifth transistor is connected to the shift signal output terminal; a gate electrode of the sixth transistor is connected to the first pull-up node, a first electrode of the sixth transistor is connected to the second clock signal terminal to receive the second clock signal and the second clock signal is used as the composite output signal, and a second electrode of the sixth transistor is connected to the pixel scanning signal output terminal; the first pull-down control circuit comprises a seventh transistor and a ninth transistor, a gate electrode of the seventh transistor is connected to a first electrode of the seventh transistor and is further configured to be connected to a third voltage terminal to receive a third voltage, and a second electrode of the seventh transistor is connected to the pull-down node; a gate electrode of the ninth transistor is connected to the first pull-up node, a first electrode of the ninth transistor is connected to the pull-down node, and a second electrode of the ninth transistor is connected to a fifth voltage terminal to receive a fifth voltage; the pull-down circuit comprises a tenth transistor, an eleventh transistor, and a twelfth transistor, a gate electrode of the tenth transistor is connected to the pull-down node, a first electrode of the tenth transistor is connected to the first pull-up node, and a second electrode of the tenth transistor is connected to the fifth voltage terminal to receive the fifth voltage; a gate electrode of the eleventh transistor is connected to the pull-down node, a first electrode of the eleventh transistor is connected to the shift signal output terminal, and a second electrode of the eleventh transistor is connected to the fifth voltage terminal to receive the fifth voltage; and a gate electrode of the twelfth transistor is connected to the pull-down node, a first electrode of the twelfth transistor is connected to the pixel scanning signal output terminal, and a second electrode of the twelfth transistor is connected to a sixth voltage terminal to receive a sixth voltage.

For example, in the shift register unit provided by an embodiment of the present disclosure, the output circuit further comprises a second capacitor, a first electrode of the second capacitor is connected to the first pull-up node, and a second electrode of the second capacitor is connected to the second electrode of the fifth transistor.

For example, in the shift register unit provided by an embodiment of the present disclosure, the first pull-down control circuit further comprises an eighth transistor, a gate electrode of the eighth transistor is connected to a first electrode of the eighth transistor and is configured to be connected to a fourth voltage terminal to receive a fourth voltage, and a second electrode of the eighth transistor is connected to a second pull-down node different from the pull-down node.

For example, in the shift register unit provided by an embodiment of the present disclosure, the first input-output unit further comprises a second pull-down control circuit and a third pull-down control circuit; the second pull-down control circuit is configured to control the level of the pull-down node in response to a first clock signal; and the third pull-down control circuit is configured to control the level of the pull-down node in response to the first display input signal.

For example, in the shift register unit provided by an embodiment of the present disclosure, the second pull-down control circuit comprises a thirteenth transistor, and the third pull-down control circuit comprises a fourteenth transistor; a gate electrode of the thirteenth transistor is connected to a first clock signal terminal to receive the first clock signal, a first electrode of the thirteenth transistor is connected to the pull-down node, and a second electrode of the thirteenth transistor is connected to a fifth voltage terminal to receive a fifth voltage; and a gate electrode of the fourteenth transistor is connected to a display input signal terminal to receive the first display input signal, a first electrode of the fourteenth transistor is connected to the pull-down node, and a second electrode of the fourteenth transistor is connected to the fifth voltage terminal to receive the fifth voltage.

For example, in the shift register unit provided by an embodiment of the present disclosure, the second pull-down control circuit comprises a thirteenth transistor and a seventeenth transistor, and the third pull-down control circuit comprises a fourteenth transistor; a gate electrode of the thirteenth transistor is connected to a first clock signal terminal to receive the first clock signal, a first electrode of the thirteenth transistor is connected to the pull-down node, and a second electrode of the thirteenth transistor is connected to a first electrode of the seventeenth transistor; a gate electrode of the seventeenth transistor is electrically connected to the pull-up control node, and a second electrode of the seventeenth transistor is connected to a fifth voltage terminal to receive a fifth voltage; and a gate electrode of the fourteenth transistor is connected to a display input signal terminal to receive the first display input signal, a first electrode of the fourteenth transistor is connected to the pull-down node, and a second electrode of the fourteenth transistor is connected to the fifth voltage terminal to receive the fifth voltage.

For example, in the shift register unit provided by an embodiment of the present disclosure, the first input-output unit further comprises a display reset circuit and a total reset circuit, the display reset circuit is configured to reset the first pull-up node in response to a display reset signal, and the total reset circuit is configured to reset the first pull-up node in response to a total reset signal.

For example, in the shift register unit provided by an embodiment of the present disclosure, the display reset circuit comprises a fifteenth transistor, and the total reset circuit comprises a sixteenth transistor; a gate electrode of the fifteenth transistor is connected to a display reset signal terminal to receive the display reset signal, a first electrode of the fifteenth transistor is connected to the first pull-up node, and a second electrode of the fifteenth transistor is connected to a fifth voltage terminal to receive a fifth voltage; and a gate electrode of the sixteenth transistor is connected to a total reset signal terminal to receive the total reset signal, a first electrode of the sixteenth transistor is connected to the first pull-up node, and a second electrode of the sixteenth transistor is connected to the fifth voltage terminal to receive the fifth voltage.

For example, in the shift register unit provided by an embodiment of the present disclosure, a circuit structure of the second input-output unit is the same as a circuit structure of the first input-output unit.

For example, the shift register unit provided by an embodiment of the present disclosure further comprises at least one third transmission circuit and at least one third input-output unit electrically connected to the at least one third transmission circuit.

At least an embodiment of the present disclosure further provides a gate driving circuit, comprising a plurality of cascaded shift register units provided by any one of the embodiments of the present disclosure.

At least an embodiment of the present disclosure further provides a display device, comprising the gate driving circuit provided by any one of the embodiments of the present disclosure and a plurality of sub-pixel units arranged in an array, the first output terminal and the second output terminal of each shift register unit in the gate driving circuit are electrically connected to sub-pixel units in different rows, respectively.

At least an embodiment of the present disclosure further provides a driving method of the shift register unit, comprising a display phase for one frame and a blanking phase for the frame, during the display phase, causing the blanking unit to charge the pull-up control node in response to the compensation selection control signal; and during the blanking phase, causing the first transmission circuit to charge the first pull-up node, by using the blanking pull-up signal, in response to the first transmission signal, and causing the second transmission circuit to charge the second pull-up node, by using the blanking pull-up signal, in response to the second transmission signal.

For example, in the driving method provided by an embodiment of the present disclosure, a timing of the first transmission signal and a timing of the second transmission signal are the same.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1:
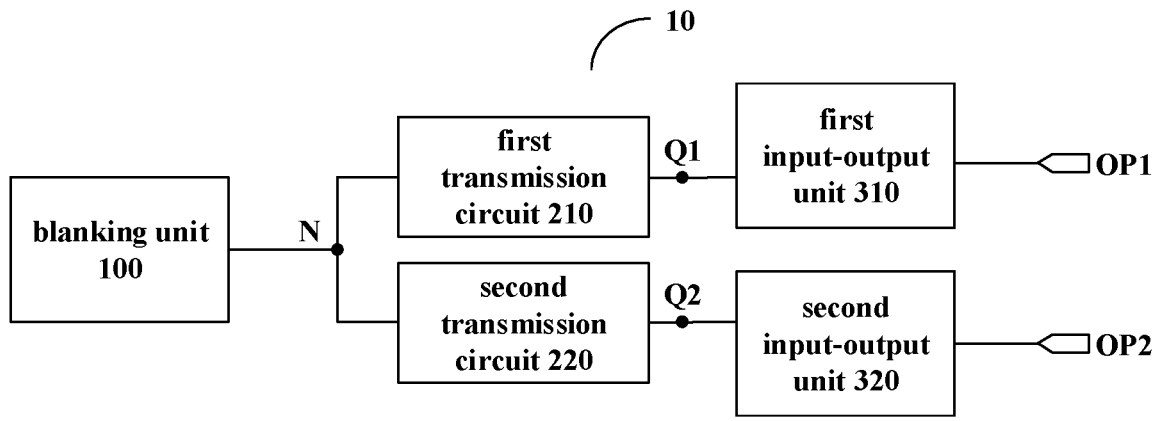
FIG. 1 is a schematic diagram of a shift register unit provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect," "connected," "coupled," etc., are not intended to define a physical connection or mechanical connection, but may include an electrical connection, directly or indirectly, that is, the "connection" may include a "direct connection" or an "indirect connection." "On," "under," "right," "left" and the like are only used to indicate relative position relationship, and when the position of the object which is described is changed, the relative position relationship may be changed accordingly.

In the embodiments of the present disclosure, for example, in a case where each circuit is implemented by an N-type transistor, the term "pull-up" means charging a node or an electrode of a transistor to allow the absolute value of the level of the node or the electrode to be increased, so as to implement a corresponding operation (e.g., turn-on) of the transistor; and the term "pull-down" means discharging a node or an electrode of a transistor to allow the absolute value of the level of the node or the electrode to be reduced, so as to implement a corresponding operation (e.g., turn-off) of the transistor.

For another example, in a case where each circuit is implemented by a P-type transistor, the term "pull-up" means discharging a node or an electrode of a transistor to allow the absolute value of the level of the node or the electrode to be reduced, so as to implement a corresponding operation (e.g., turn-on) of the transistor; and the term "pull-down" means charging a node or an electrode of a transistor to allow the absolute value of the level of the node or the electrode to be increased, so as to implement a corresponding operation (e.g., turn-off) of the transistor.

Moreover, the specific meanings of the terms "pull-up" and "pull-down" may further be accordingly adjusted based on the specific type of the transistor, as long as the transistor can be controlled to implement the corresponding switch function.

Currently, a gate driving circuit for OLED usually includes three sub-circuits, that is, a detecting circuit, a display circuit, and a connecting circuit (or a gate circuit) for outputting a composite pulse of the detecting circuit and the display circuit. The circuit structure of that gate driving circuit is very complicated and cannot satisfy the requirements for a high resolution and a narrow bezel.

When compensating a sub-pixel unit in the OLED display panel, in addition to setting a pixel compensating circuit in the sub-pixel unit for internal compensation, external compensation may also be performed by setting a sensing transistor. When the external compensation is performed, the gate driving circuit including shift register units needs to provide the sub-pixel unit in the display panel with a driving signal for a scanning transistor and a driving signal for the sensing transistor, respectively. For example, the gate driving circuit provides a scan driving signal for the scanning transistor in a display phase of one frame, and provides a sense driving signal for the sensing transistor in a blanking phase of one frame.

In an external compensation method, the sense driving signal output by the gate driving circuit sequentially scans rows of sub-pixel units line by line. For example, during a blanking phase of a first frame, a sense driving signal for sub-pixel units of a first row of a display panel is output. During a blanking phase of a second frame, a sense driving signal for sub-pixel units of a second row of the display panel is output. And so on, the sense driving signals are outputted sequentially at a frequency of outputting the sense driving signals corresponding to one row of sub-pixel units per frame, that is, the progressive sequential compensation of the display panel is completed.

However, in a case where the above-mentioned progressive sequential compensation method is adopted, the following problems of poor display may occur. One is that there is a scanning line that moves progressively during the scanning display of a plurality of frames of images. The other one is that there are differences in the timing of external compensation, which may cause a large difference in brightness of different regions of the display panel. For example, when the external compensation is performed on the sub-pixel units in the 100th row of the display panel, although the sub-pixel units in the 10th row of the display panel have been externally compensated, at this time, the luminous brightness of the sub-pixel units in the 10th row may have changed, such as a decrease in luminous brightness, which may cause uneven brightness in different regions of the display panel. This problem is more pronounced in large-sized display panels.

As described above, in a case where a gate driving circuit drives a display panel to achieve the external compensation, the gate driving circuit is required to output not only a scan driving signal for a display phase, but also a sense driving signal for a blanking phase, that is, a blanking unit dedicated to the blanking phase is required. In this case, the area occupied by the gate driving circuit may be relatively large, so that a size of a bezel of a display device using the gate driving circuit is larger.

At least an embodiment of the present disclosure provides a shift register unit, which includes a blanking unit, a first transmission circuit, a second transmission circuit, a first input-output unit, and a second input-output unit. The blanking unit is configured to charge a pull-up control node in response to a compensation selection control signal and input a blanking pull-up signal to a blanking pull-up node. The first input-output unit comprises a first pull-up node and a first output terminal, and the second input-output unit comprises a second pull-up node and a second output terminal. The first transmission circuit is electrically connected to the blanking pull-up node and the first pull-up node, and is configured to charge the first pull-up node, by using the blanking pull-up signal, in response to a first transmission signal. The second transmission circuit is electrically connected to the blanking pull-up node and the second pull-up node, and is configured to charge the second pull-up node, by using the blanking pull-up signal, in response to a second transmission signal. The first input-output unit is configured to charge the first pull-up node in response to a first display input signal, and is configured to output a composite output signal to the first output terminal under control of a level of the first pull-up node. The second input-output unit is configured to charge the second pull-up node in response to a second display input signal, and is configured to output the composite output signal to the second output terminal under control of a level of the second pull-up node.

The embodiments of the present disclosure further provide a gate driving circuit, a display device, and a driving method corresponding to the shift register unit described above.

The shift register unit, the gate driving circuit, the display device and the driving method provided in the embodiments of the present disclosure can share a blanking unit, so that the display device using the shift register unit can reduce the size of the bezel and reduce the cost. In addition, under the premise of taking into account the progressive sequential compensation (such as the need for progressive sequential compensation in a shutdown detection), a random compensation can also be implemented, so that poor display problems such as scanning lines and uneven display brightness caused by progressive sequential compensation can be avoided.

It should be noted that, in the embodiments of the present disclosure, the random compensation refers to an external compensation method that is different from the progressive sequential compensation. By adopting the random compensation, a sense driving signal corresponding to sub-pixel units of any row in the display panel can be output randomly during a blanking phase of a frame. The following embodiments are the same in this aspect and will not be repeated herein.

In addition, in the embodiments of the present disclosure, for the purpose of description, the term "one frame", "each frame" or "a frame" includes a display phase and a blanking phase which are sequentially performed. For example, in the display phase, the gate driving circuit outputs a display output signal, and the display output signal can drive the display panel from the first row to the last row to perform a scanning display of one complete image; and in the blanking phase, the gate driving circuit outputs a blanking output signal, and the blanking output signal can be used to drive sensing transistors in one row of sub-pixel units in the display panel to perform external compensation on the sub-pixel units in the row.

The embodiments of the present disclosure and examples thereof will be described in detail below with reference to the drawings.

At least an embodiment of the present disclosure provides a shift register unit 10, and as illustrated in FIG. 1, the shift register unit 10 includes a blanking unit 100, a first transmission circuit 210, a second transmission circuit 220, a first input-output unit 310, and a second input-output unit 320. The first input-output unit 310 includes a first pull-up node Q1 and a first output terminal OP1, and the second input-output unit Q2 includes a second pull-up node Q2 and a second output terminal OP2. A plurality of the shift register units 10 can be cascaded to create a gate driving circuit provided by an embodiment of the present disclosure.

The blanking unit 100 is configured to charge a pull-up control node H in response to a compensation selection control signal and input a blanking pull-up signal to a blanking pull-up node N. For example, in a display phase of one frame, the blanking unit 100 can charge the pull-up control node H in response to the compensation selection control signal. For example, in a display phase or a blanking phase of one frame, the blanking unit 100 can input the blanking pull-up signal to the blanking pull-up node N.

The first transmission circuit 210 is electrically connected to the blanking pull-up node N and the first pull-up node Q1, and is configured to charge the first pull-up node Q1, by using the blanking pull-up signal, in response to a first transmission signal. For example, the first transmission circuit 210 may be connected to a first transmission signal terminal TS1 to receive the first transmission signal. The first transmission circuit 210 is turned on under control of the first transmission signal, so that the first pull-up node Q1 can be charged by using the blanking pull-up signal obtained by the blanking pull-up node N. For example, in some embodiments, the first transmission signal terminal TS1 may be a first clock signal terminal CLKA, that is, the first transmission signal is a first clock signal received by the first clock signal terminal CLKA.

The second transmission circuit 220 is electrically connected to the blanking pull-up node N and the second pull-up node Q2, and is configured to charge the second pull-up node Q2, by using the blanking pull-up signal, in response to a second transmission signal. For example, the second transmission circuit 220 may be connected to a second transmission signal terminal TS2 to receive the second transmission signal. The second transmission circuit 220 is turned on under control of the second transmission signal, so that the second pull-up node Q2 can be charged by using the blanking pull-up signal obtained by the blanking pull-up node N. For example, in some embodiments, the second transmission signal terminal TS2 may be the first clock signal terminal CLKA, that is, the second transmission signal is the first clock signal received by the first clock signal terminal CLKA.

It should be noted that, in the embodiments of the present disclosure, charging a node (for example, the pull-up control node H, the first pull-up node Q1, the second pull-up node Q2, etc.) means that, for example, electrically connecting the node to a high-level voltage signal, so that the high-level voltage signal is used to pull up the level of the node. Discharging (or resetting) a node means, for example, electrically connecting the node to a low-level voltage signal, so that the low-level voltage signal is used to pull down the level of the node. For example, a capacitor electrically connected to the node can be set, and charging or discharging the node means charging or discharging the capacitor electrically connected to the node.

The first input-output unit 310 is configured to charge the first pull-up node Q1 in response to a first display input signal, and is configured to output a composite output signal to the first output terminal OP1 under control of a level of the first pull-up node Q1. For example, during a display phase of one frame, the first input-output unit 310 can output a scan driving signal, and the scan driving signal can drive a row of sub-pixel units in the display panel to perform scanning display. For another example, during a blanking phase of one frame, the first input-output unit 310 can output a sense driving signal, and the sense driving signal can be used to drive sensing transistors in a row of sub-pixel units in the display panel to complete an external compensation for the sub-pixel units of the row.

The second input-output unit 320 is configured to charge the second pull-up node Q2 in response to a second display input signal, and is configured to output a composite output signal to the second output terminal OP2 under control of a level of the second pull-up node Q2. For example, during a display phase of one frame, the second input-output unit 320 can output a scan driving signal, and the scan driving signal can drive a row of sub-pixel units in the display panel to perform scanning display. For another example, during a blanking phase of one frame, the second input-output unit 320 can output a sense driving signal, and the sense driving signal can be used to drive sensing transistors in a row of sub-pixel units in the display panel to complete an external compensation for the sub-pixel units of the row.

Figure 2:
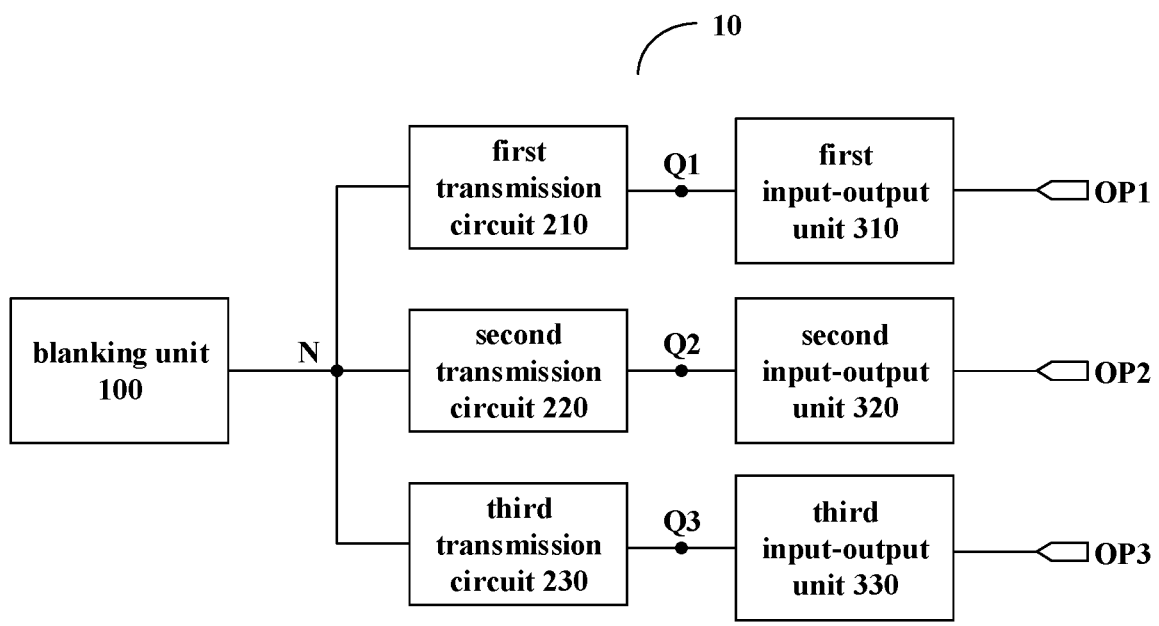
FIG. 2 is a schematic diagram of another shift register unit provided by some embodiments of the present disclosure.

For example, some embodiments of the present disclosure further provide a shift register unit 10. As illustrated in FIG. 2, the shift register unit 10 is different from the shift register unit 10 as illustrated in FIG. 1 in that it further includes a third transmission circuit 230 and a third input-output unit 330 electrically connected to the third transmission circuit 230.

For example, the third transmission circuit 230 is electrically connected to the blanking pull-up node N and a third pull-up node Q3, and is configured to charge the third pull-up node Q3, by using the blanking pull-up signal, in response to a third transmission signal. The third input-output unit 330 is configured to charge the third pull-up node Q3 in response to a third display input signal, and is configured to output a composite output signal to the third output terminal OP3 under control of a level of the third pull-up node Q3.

A plurality of input-output units (for example, the first input-output unit 310, the second input-output unit 320, the third input-output unit 330, etc.) in the shift register unit 10 provided by some embodiments of the present disclosure can share one blanking unit 100, so that the circuit structure can be simplified, and the display device using the shift register unit 10 can reduce the size of the bezel and reduce the cost.

It should be noted that FIG. 1 and FIG. 2 are only two examples of the present disclosure. The shift register unit 10 provided by the embodiment of the present disclosure may further include more transmission circuits and more input-output units, the number of the transmission circuit and the number of the input-output unit can be set according to the actual situation, which is not limited in the embodiments of the present disclosure.

Figure 3:
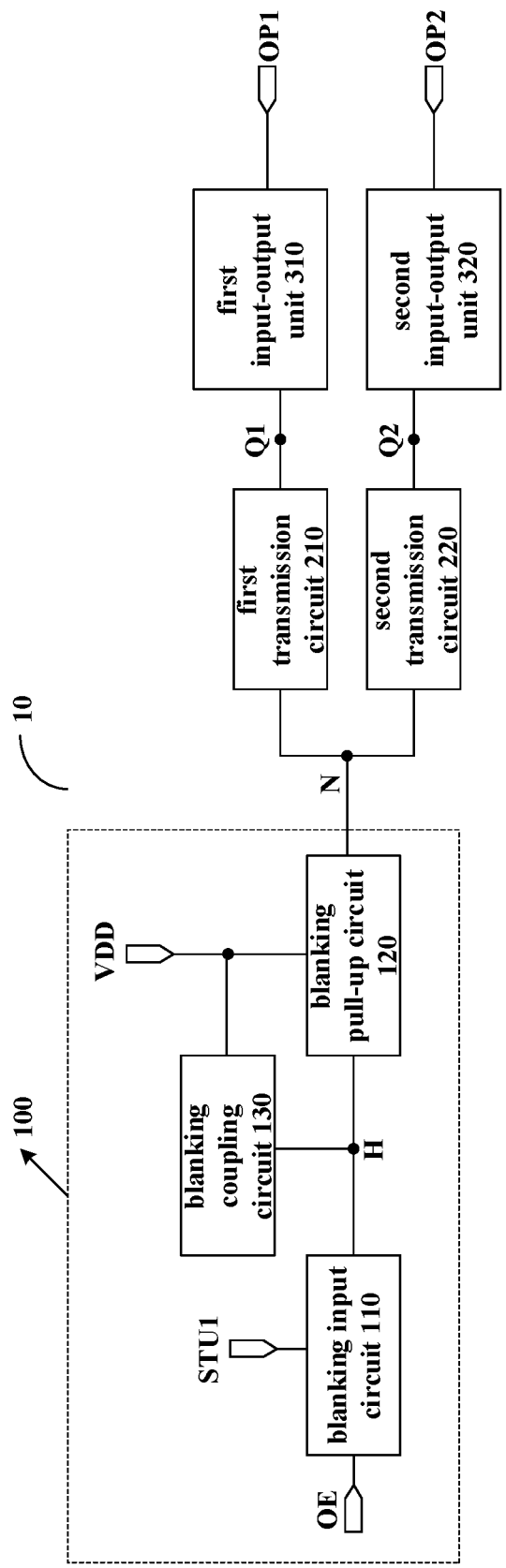
FIG. 3 is a schematic diagram of further still another shift register unit provided by some embodiments of the present disclosure.

As illustrated in FIG. 3, in some embodiments of the present disclosure, the blanking unit 100 includes a blanking input circuit 110 and a blanking pull-up circuit 120.

The blanking input circuit 110 is configured to charge the pull-up control node H in response to the compensation selection control signal, and to maintain a level of the pull-up control node H. For example, in some embodiments, the blanking input circuit 110 may be connected to a blanking input signal terminal STU1 and a compensation selection control terminal OE, so that the blanking input circuit 110 can charge the pull-up control node H, under control of the compensation selection control signal input by the compensation selection control terminal OE, by using the blanking input signal input by the blanking input signal terminal STU1, and to maintain the level of the pull-up control node H. For example, the blanking input circuit 110 can charge the pull-up control node H in a display phase of one frame, thereby pulling up the level of the pull-up control node H to a high level, and can maintain the high level of the pull-up control node H until a blanking phase of the frame.

The blanking pull-up circuit 120 is configured to input the blanking pull-up signal to the blanking pull-up node N under control of the level of the pull-up control node H. For example, in some embodiments, the blanking pull-up circuit 120 can be connected to a second voltage terminal VDD to receive a second voltage and use the second voltage as the blanking pull-up signal. For another example, the blanking pull-up circuit 120 can further be connected to the first clock signal terminal CLKA to receive the first clock signal and use the first clock signal as the blanking pull-up signal. For example, when the pull-up control node H is at a high level, the blanking pull-up circuit 120 is turned on, so that the blanking pull-up signal can be input to the blanking pull-up node N.

It should be noted that, in the embodiments of the present disclosure, the second voltage terminal VDD can be configured to, for example, provide a DC high-level signal, that is, the second voltage is a high level, which are the same in the following embodiments and will not be described again.

As illustrated in FIG. 3, the blanking unit 100 further include a blanking coupling circuit 130. The blanking coupling circuit 130 is electrically connected to the pull-up control node H, and is configured to pull-up, by coupling, the level of the pull-up control node H. For example, in some embodiments, the blanking coupling circuit 130 may be connected to the second voltage terminal VDD to receive the second voltage. For another example, the blanking coupling circuit 130 may further be connected to the first clock signal terminal CLKA to receive the first clock signal. For example, when the pull-up control node H is at a high level, the blanking coupling circuit can pull up, by coupling, the pull-up control node H by using the second voltage or the first clock signal, so as to avoid leakage current at the pull-up control node H.

It should be noted that, in the embodiment of the present disclosure, the blanking unit (for example, including the blanking input circuit, the blanking pull-up circuit, and the blanking coupling circuit) is provided in the shift register unit in order to implement that a blanking output signal can be output during a blanking phase of one frame. The "blanking" of the blanking input circuit, the blanking pull-up circuit, and the blanking coupling circuit only indicates that these circuits are related to the blanking phase, and does not limit these circuits to work only in the blanking phase. The following embodiments are the same in this aspect and will not be repeated herein.

Figure 5:
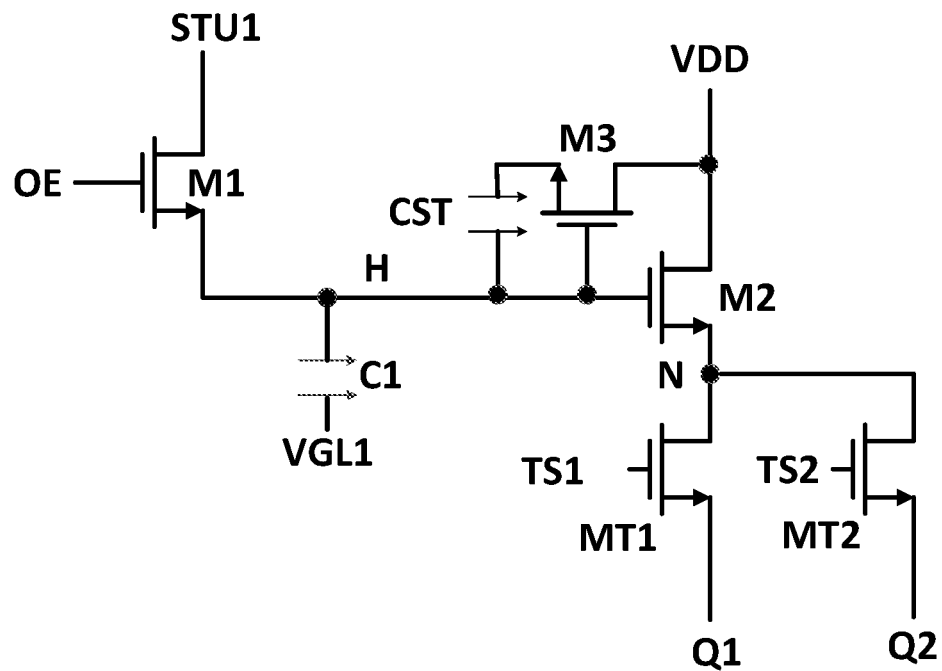
FIG. 5 is a circuit diagram including a blanking unit, a first transmission circuit and a second transmission circuit provided by some embodiments of the present disclosure.
Figure 6:
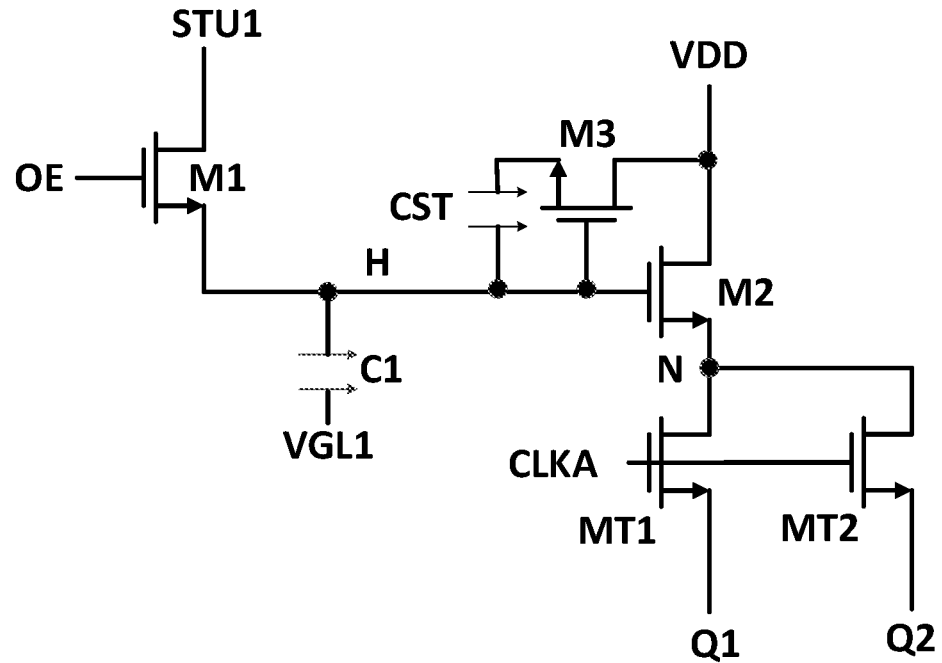
FIG. 6 is another circuit diagram including a blanking unit, a first transmission circuit and a second transmission circuit provided by some embodiments of the present disclosure.

As illustrated in FIG. 5 and FIG. 6, in some embodiments, the blanking input circuit 110 can be implemented to include a first transistor M1 and a first capacitor C1. A gate electrode of the first transistor M1 is connected to the compensation selection control terminal OE to receive the compensation selection control signal, a first electrode of the first transistor M1 is connected to the blanking input signal terminal STU1 to receive the blanking input signal, a second electrode of the first transistor M1 is connected to the pull-up control node H, and the above-mentioned connection includes a direct connection or an indirect connection. For example, when the compensation selection control signal is a high-level turn-on signal, the first transistor M1 is turned on, so that the blanking input signal can be used to charge the pull-up control node H.

A first electrode of the first capacitor C1 is connected to the pull-up control node H, and a second electrode of the first capacitor C1 is connected to a first voltage terminal VGL1. The level of the pull-up control node H can be maintained by setting the first capacitor CL. For example, during a display phase of one frame, the blanking input circuit 110 charges the pull-up control node H to a high level, and the first capacitor C1 can maintain the high level of the control node H to a blanking phase of the frame. It should be noted that, in the embodiment of the present disclosure, the second electrode of the first capacitor C1 can be connected to other voltage terminals in addition to the first voltage terminal VGL1, for example, the second electrode of the first capacitor C1 is grounded. The embodiments of the present disclosure are not limited thereto. In this embodiment, the first voltage terminal is illustrated by taking VGL1 as an example, but it should be noted that the first voltage terminal may also be such as VDD.

It should be noted that, in the embodiments of the present disclosure, the first voltage terminal VGL1 can be configured to, for example, provide a DC low-level signal, that is, the first voltage is a low level, which are the same in the following embodiments and will not be described again.

As illustrated in FIG. 5 and FIG. 6, in some embodiments, the blanking pull-up circuit 120 can be implemented as a second transistor M2. A gate electrode of the second transistor M2 is connected to the pull-up control node H, a first electrode of the second transistor M2 is connected to the second voltage terminal VDD to receive the second voltage and use the second voltage as the blanking pull-up signal, and a second electrode of the second transistor M2 is connected to the blanking pull-up node N.

For example, when the pull-up control node H is at a high level, the second transistor M2 is turned on, thereby inputting the blanking pull-up signal to the pull-up node N. For example, as illustrated in FIG. 7, in some other embodiments, the first electrode of the second transistor M2 may further be connected to the first clock signal terminal CLKA to receive the first clock signal and use the first clock signal as the blanking pull-up signal.

As illustrated in FIG. 5 and FIG. 6, in some embodiments, the blanking coupling circuit 130 can be implemented to include a coupling capacitor CST and a third transistor M3. A gate electrode of the third transistor M3 is connected to the pull-up control node H, a first electrode of the third transistor M3 is connected to the second voltage terminal VDD to receive the second voltage, and a second electrode of the third transistor M3 is connected to a first electrode of the coupling capacitor CST, and a second electrode of the coupling capacitor CST is connected to the pull-up control node H. For example, when the pull-up control node H is at a high level, the third transistor M3 is turned on, so that the second voltage can be applied to the first electrode of the coupling capacitor CST. The high-level second voltage can pull up, by coupling, the level of the pull-up control node H by the coupling capacitor CST, thereby avoiding leakage current at the control node H.

Figure 7:
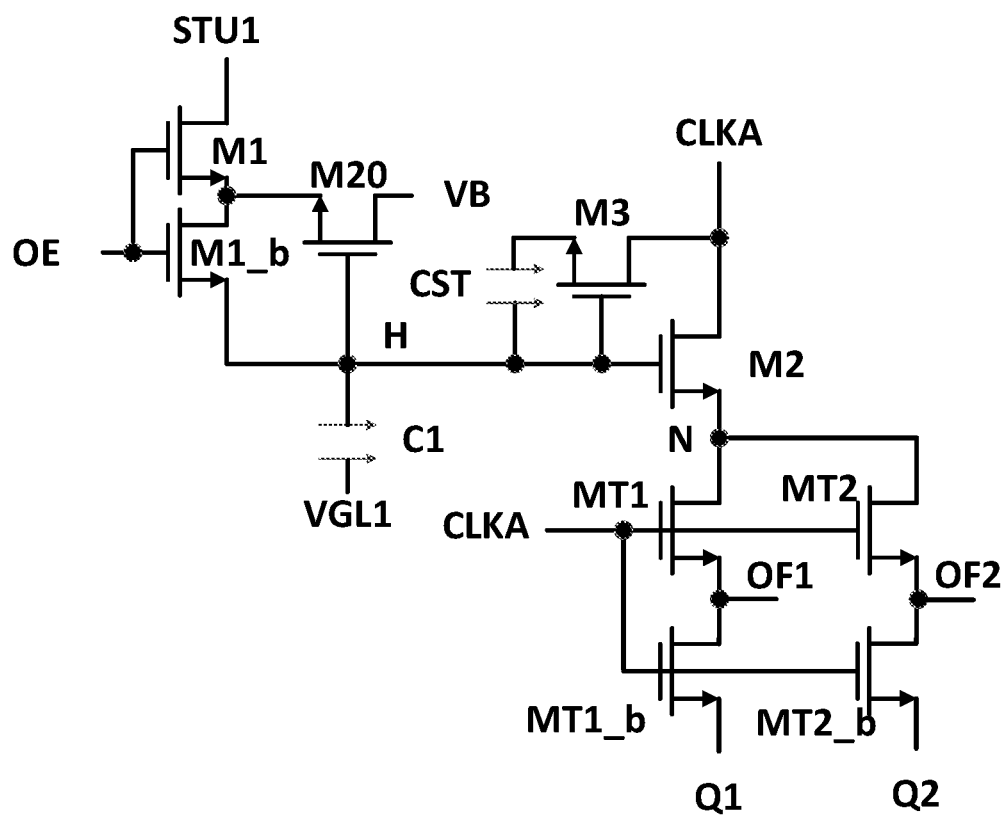
FIG. 7 is further still another circuit diagram including a blanking unit, a first transmission circuit and a second transmission circuit provided by some embodiments of the present disclosure.

For example, as illustrated in FIG. 7, in some other embodiments, the first electrode of the third transistor M3 may further be connected to the first clock signal terminal CLKA to receive the first clock signal. For example, when the pull-up control node H is at a high level, the third transistor M3 is turned on, so that the first clock signal can be applied to the first electrode of the coupling capacitor CST. When the first clock signal is at a high level, the first clock signal can pull up, by coupling, the level of the pull-up control node H by the coupling capacitor CST, thereby avoiding leakage current at the control node H.

As illustrated in FIG. 5, in some embodiments of the present disclosure, the first transmission circuit 210 can be implemented as a first transmission transistor MT1. A gate electrode of the first transmission transistor MT1 is connected to a first transmission signal terminal TS1 to receive the first transmission signal, and a first electrode of the first transmission transistor MT1 is connected to the blanking pull-up node N to receive the blanking pull-up signal, and a second electrode of the first transmission transistor MT1 is connected to the first pull-up node Q1. For example, when the first transmission signal is at a high level, the first transmission transistor MT1 is turned on, so that the first pull-up node Q1 can be charged by using the blanking pull-up signal.

As illustrated in FIG. 5, in some embodiments of the present disclosure, the second transmission circuit 220 can be implemented as a second transmission transistor MT2. A gate electrode of the second transmission transistor MT2 is connected to a second transmission signal terminal TS2 to receive the second transmission signal, and a first electrode of the second transmission transistor MT2 is connected to the blanking pull-up node N to receive the blanking pull-up signal, and a second electrode of the second transmission transistor MT2 is connected to the second pull-up node Q2. For example, when the second transmission signal is at a high level, the second transmission transistor MT2 is turned on, so that the second pull-up node Q2 can be charged by using the blanking pull-up signal.

For example, as illustrated in FIG. 6, in some embodiments, the gate electrode of the first transmission transistor MT1 and the gate electrode of the second transmission transistor MT2 can both be connected to the first clock signal terminal CLKA to receive the same first clock signal. When the first clock signal is at a high level, the first transmission transistor MT1 and the second transmission transistor MT2 are turned on at the same time, so that the first pull-up node Q1 and the second pull-up node Q2 can be charged simultaneously by using the blanking pull-up signal.

Figure 4:
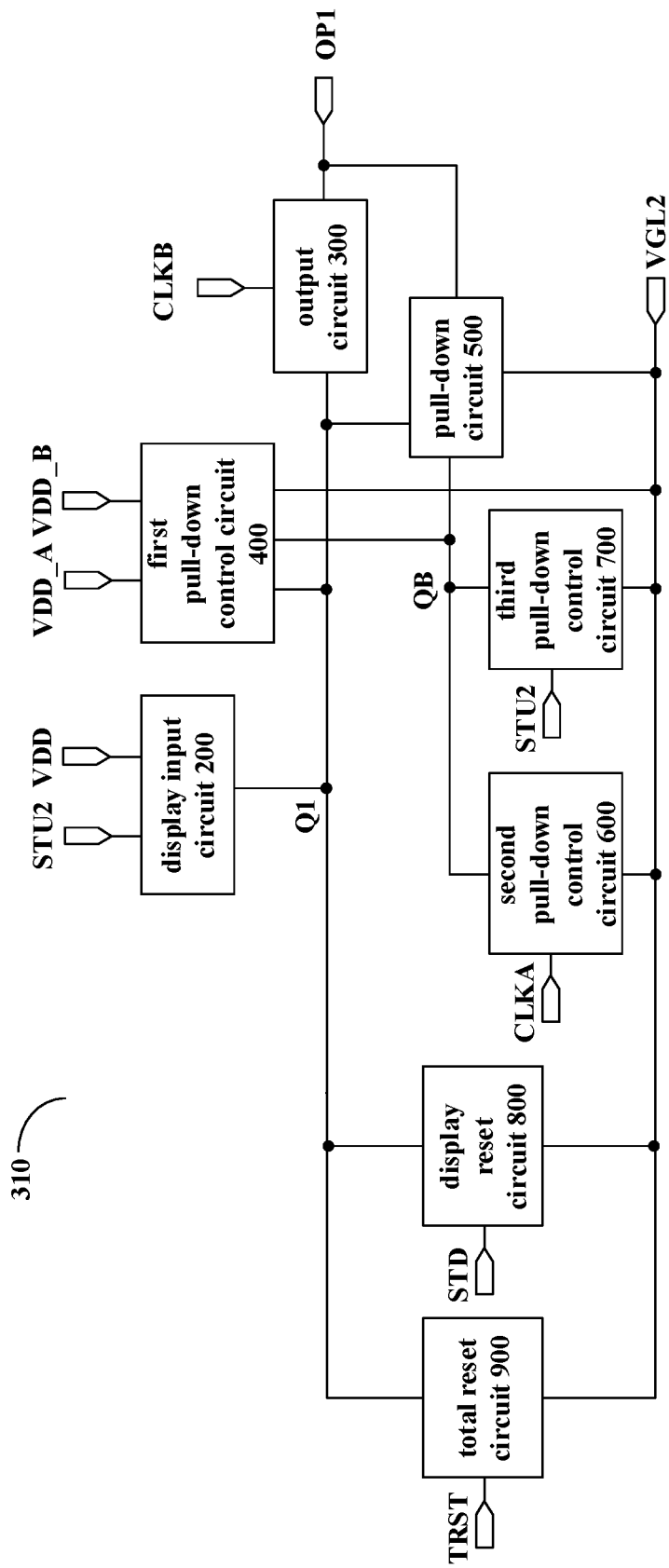
FIG. 4 is a schematic diagram of a first input-output unit of a shift register unit provided by some embodiments of the present disclosure.

As illustrated in FIG. 4, in the shift register unit 10 provided by the embodiment of the present disclosure, the first input-output unit 310 includes a display input circuit 200, an output circuit 300, a first pull-down control circuit 400, and a pull-down circuit 500.

The first output terminal OP1 comprises a shift signal output terminal CR and a pixel scanning signal output terminal OUT, and the shift signal output terminal CR and the pixel scanning signal output terminal OUT output the composite output signal.

The display input circuit 200 is configured to charge the first pull-up node Q1 in response to the first display input signal. For example, in some embodiments, the display input circuit 200 may be connected to a display input signal terminal STU2 to receive a first display input signal, so that the display input circuit 200 is turned on under control of the first display input signal. For example, the display input circuit 200 may further be connected to the second voltage terminal VDD to receive the second voltage. For example, during a display phase of one frame, the display input circuit 200 is turned on under control of the first display input signal, so that the first pull-up node Q1 can be charged by using the second voltage.

For example, in a case where a plurality of input-output units are cascaded, the display input signal terminal STU2 of each stage of the input-output units may be electrically connected to the output terminal of a previous second-stage input-output unit. For example, in a case where the output terminal includes the shift signal output terminal CR and the pixel scanning signal output terminal OUT, the display input signal terminal STU2 of the present-stage input-output unit may be electrically connected to the shift signal output terminal CR of the previous second-stage input-output unit.

In addition, in the embodiments of the present disclosure, "a previous second-stage input-output unit" means a previous second input-output unit from the present-stage input-output unit, and "a next third-stage input-output unit" means a next third input-output unit from the present-stage input-output unit. The "previous" and "next" are relative, and the following embodiments are the same in this aspect and will not be repeated herein.

It should be noted that, in the embodiments of the present disclosure, the display input circuit 200 can further use other configurations, as long as the corresponding functions can be implemented, and the embodiments of the present disclosure are not limited thereto.

The output circuit 300 is configured to output the composite output signal to the first output terminal OP1 under control of the level of the first pull-up node Q1. For example, in some embodiments, the output circuit 300 may be connected to a second clock signal terminal CLKB to receive a second clock signal, and use the second clock signal as the composite output signal. For example, the composite output signal may include a display output signal and a blanking output signal. During a display phase of one frame, the output circuit 300 outputs the display output signal to the first output terminal OP1 under control of the level of the first pull-up node Q1. For example, in some embodiments, the first output terminal OP1 may include the shift signal output terminal CR and the pixel scanning signal output terminal OUT, the display output signal output from the shift signal output terminal CR can be used for the scanning shift of a previous-stage shift register unit of a next-stage shift register unit, and the display output signal output from the pixel scanning signal output terminal OUT can be used to drive sub-pixel units in the display panel to perform scan display. During a blanking phase of one frame, the output circuit 300 outputs the blanking output signal to the first output terminal OP1 under control of the level of the first pull-up node Q1, and the blanking output signal can be used to drive the sensing transistor.

The first pull-down control circuit 400 is configured to control a level of a pull-down node QB under control of the level of the first pull-up node Q1. For example, in one example, the first pull-down control circuit 400 is connected to a third voltage terminal VDD_A and a fifth voltage terminal VGL2. It should be noted that, in the embodiments of the present disclosure, the fifth voltage terminal VGL2 may be configured to provide a fifth voltage, for example, the fifth voltage is a DC low-level signal. The following embodiments are the same in this aspect and will not be repeated herein.

For example, when the first pull-up node Q1 is at a high level, the first pull-down control circuit 400 can pull down the pull-down node QB to a low level by using the low-level fifth voltage provided by the fifth voltage terminal VGL2. For another example, when the first pull-up node Q1 is at a low level, the first pull-down control circuit 400 can charge the pull-down node QB by using a third voltage (for example, a high level) input by the third voltage terminal VDD_A, so as to pull up the pull-down node QB to a high level.

In some other examples, the first pull-down control circuit 400 may further be connected to a fourth voltage terminal VDD_B to receive a fourth voltage (for example, a high level). For example, the third voltage terminal VDD_A and the fourth voltage terminal VDD_B can be configured to input a high-level voltage alternately, that is, in a case where the third voltage terminal VDD_A inputs a high-level voltage, the fourth voltage terminal VDD_B inputs a low-level voltage, and in a case where the third voltage terminal VDD_A inputs a low-level voltage, the fourth voltage terminal VDD_B inputs a high-level voltage.

The pull-down circuit 500 is configured to pull down and reset the first pull-up node Q1 and the first output terminal OP1. For example, in a case where the first output terminal OP1 includes the shift signal output terminal CR and the pixel scanning signal output terminal OUT, the pull-down circuit 500 can pull-down and reset the shift signal output terminal CR and the pixel scanning signal output terminal OUT at the same time.

For example, the pull-down circuit 500 is connected to the fifth voltage terminal VGL2. When the pull-down circuit 500 is turned on under control of the level of the pull-down node QB, the pull-up node Q1, the shift signal output terminal CR, and the pixel scanning signal output terminal OUT are pulled down to perform resetting by using the low-level fifth voltage provided by the fifth voltage terminal VGL2.

In some embodiments, as illustrated in FIG. 4, the first input-output unit 310 further includes a second pull-down control circuit 600, and the second pull-down control circuit 600 is configured to control the level of the pull-down node QB in response to the first clock signal. For example, in one example, the second pull-down control circuit 600 may be connected to the first clock signal terminal CLKA to receive the first clock signal, and further be connected to the fifth voltage terminal VGL2 to receive the low-level fifth voltage. For example, during a blanking phase of one frame, the second pull-down control circuit 600 can be turned on in response to the first clock signal, so as to control the level of the pull-down node QB by using the low-level fifth voltage, for example, to pull down the level of the pull-down node QB.

In some embodiments, as illustrated in FIG. 4, the first input-output unit 310 further includes a third pull-down control circuit 700, and the third pull-down control circuit 700 is configured to control the level of the pull-down node QB in response to the first display input signal. For example, the third pull-down control circuit 700 may be connected to the display input signal terminal STU2 to receive the first display input signal, and further be connected to the fifth voltage terminal VGL2 to receive the low-level fifth voltage. For example, during a display phase of one frame, the third pull-down control circuit 700 can be turned on in response to the first display input signal, so as to control the level of the pull-down node QB by using the low-level fifth voltage, for example, to pull down the level of the pull-down node QB. Pulling down the level of the pull-down node QB to a low level can avoid the influence of the level of the pull-down node QB on the level of the first pull-up node Q1, so that the display input circuit 200 can charge the first pull-up node Q1 more sufficiently during the display phase.

In some embodiments, as illustrated in FIG. 4, the first input-output unit 310 further includes a display reset circuit 800, and the display reset circuit 800 is configured to reset the first pull-up node Q1 in response to a display reset signal. For example, in one example, the display reset circuit 800 may be connected to a display reset signal terminal STD to receive the display reset signal, and further be connected to the fifth voltage terminal VGL2 to receive the low-level fifth voltage. For example, during a display phase of one frame, the display reset circuit 800 can be turned on in response to the display reset signal, so that reset the first pull-up node Q1 by using the low-level fifth voltage provided by the fifth voltage terminal VGL2. For example, in a case where a plurality of input-output units are cascaded, the display reset signal terminal STD of each stage of the input-output units may be electrically connected to the output terminal (for example, the shift signal output terminal CR) of a next third-stage input-output unit.

In some embodiments, as illustrated in FIG. 4, the first input-output unit 310 further includes a total reset circuit 900, and the total reset circuit 900 is configured to reset the first pull-up node Q1 in response to a total reset signal. For example, in one example, the total reset circuit 900 is connected to a total reset signal terminal TRST to receive the total reset signal, and is further connected to the fifth voltage terminal VGL2 to receive the low-level fifth voltage. For example, in a case where a plurality of input-output units are cascaded, before a display phase of one frame, the total reset circuit 900 in each stage of the input-output units is turned on in response to the total reset signal, so that the first pull-up node Q1 can be reset by using the low-level fifth voltage provided by the fifth voltage terminal VGL2, thereby implementing a total reset for each stage of the input-output units.

It should be understood by those skilled in the art that although the first input-output unit 310 as illustrated in FIG. 4 shows the first pull-down control circuit 400, the pull-down circuit 500, the second pull-down control circuit 600, the third pull-down control circuit 700, the display reset circuit 800, and the total reset circuit 900, the above examples do not limit the protection scope of the present disclosure. In a practical application, those skilled in the art can select one or more of the above circuits according to a situation, and various combinations based on the above various circuits are not deviated from the principle of the present disclosure. Details are not described herein again.

Figure 8:
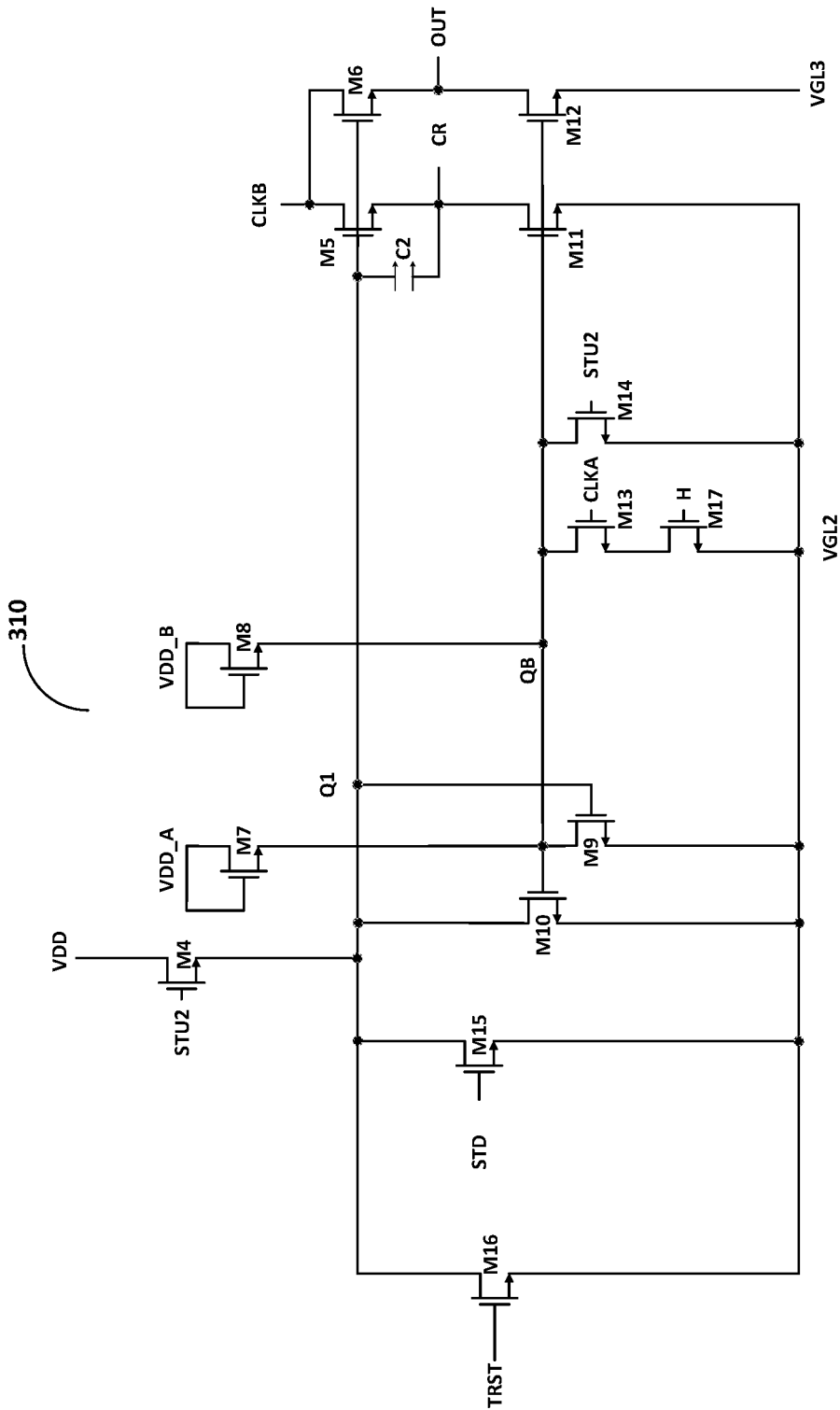
FIG. 8 is a circuit diagram of a first input-output unit provided by some embodiments of the present disclosure.

In some embodiments of the present disclosure, the first input-output unit 310 as illustrated in FIG. 4 can be implemented as the circuit structure as illustrated in FIG. 8. As illustrated in FIG. 8, the first input-output unit 310 includes fourth to seventeenth transistors M4-M17, and a second capacitor C2. The first output terminal OP1 includes the shift signal output terminal CR and the pixel scanning signal output terminal OUT, and both the shift signal output terminal CR and the pixel scanning signal output terminal OUT can both output the composite output signal. It should be noted that all the transistors as illustrated in FIG. 8 are described by taking N-type transistors as an example. In addition, the transistors as illustrated in other drawings of the present disclosure are also described by taking N-type transistors as an example, and details are not described herein again.

As illustrated in FIG. 8, the display input circuit 200 can be implemented as a fourth transistor M4, a gate electrode of the fourth transistor M4 is connected to the display input terminal STU2 to receive the first display input signal, a first electrode of the fourth transistor M4 is connected to the second voltage terminal VDD to receive the second voltage, and a second electrode of the fourth transistor M4 is connected to the first pull-up node Q1. For example, during a display phase of one frame, the fourth transistor M4 is turned on under control of the first display input signal, so that the first pull-up node Q1 can be charged by using the second voltage.

As illustrated in FIG. 8, the output circuit 300 can be implemented to include a fifth transistor M5, a sixth transistor M6, and a second capacitor C2. A gate electrode of the fifth transistor M5 is connected to the first pull-up node Q1, a first electrode of the fifth transistor M5 is connected to the second clock signal terminal CLKB to receive the second clock signal and the second clock signal is used as the composite output signal, and a second electrode of the fifth transistor M5 is connected to the shift signal output terminal CR. A gate electrode of the sixth transistor M6 is connected to the first pull-up node Q1, a first electrode of the sixth transistor M6 is connected to the second clock signal terminal CLKB to receive the second clock signal and the second clock signal is used as the composite output signal, and a second electrode of the transistor M6 is connected to the pixel scanning signal output terminal OUT. A first electrode of the second capacitor C2 is connected to the first pull-up node Q1, and a second electrode of the second capacitor C2 is connected to the second electrode of the fifth transistor M5. For example, the first electrode of the second capacitor C2 is connected to the first pull-up node Q1, and the second electrode of the second capacitor C2 is connected to the second electrode of the sixth transistor M6. For example, when the level of the first pull-up node Q1 is a high level, the fifth transistor M5 and the sixth transistor M6 are turned on, so that the second clock signal can be output as the composite output signal to the shift signal output terminal CR and the pixel scanning signal output terminal OUT respectively.

As illustrated in FIG. 8, the first pull-down control circuit 400 can be implemented to include a seventh transistor M7, an eighth transistor M8, and a ninth transistor M9. A gate electrode of the seventh transistor M7 is connected to a first electrode of the seventh transistor M7 and is configured to be connected to the third voltage terminal VDD_A to receive the third voltage, and a second electrode of the seventh transistor M7 is connected to the pull-down node QB. A gate electrode of the eighth transistor M8 is connected to a first electrode of the eighth transistor M8 and is configured to be connected to the fourth voltage terminal VDD_B to receive the fourth voltage, and a second electrode of the eighth transistor M8 is connected to the pull-down node QB. A gate electrode of the ninth transistor M9 is connected to the first pull-up node Q1, a first electrode of the ninth transistor M9 is connected to the pull-down node QB, and a second electrode of the ninth transistor M9 is connected to the fifth voltage terminal VGL2 to receive the fifth voltage.

For example, the third voltage terminal VDD_A and the fourth voltage terminal VDD_B can be configured to alternately input a high-level voltage, that is, in a case where the third voltage terminal VDD_A inputs a high-level voltage, the fourth voltage terminal VDD_B inputs a low-level voltage, and in a case where the third voltage terminal VDD_A inputs a low-level voltage, the fourth voltage terminal VDD_B inputs a high-level voltage. That is, only one of the seventh transistor M7 and the eighth transistor M8 is in a turn-on state, which can avoid performance drift caused by long-term turn-on of the transistor. In a case where the seventh transistor M7 or the eighth transistor M8 is turned on, the third voltage or the fourth voltage can charge the pull-down node QB, thereby pulling up the level of the pull-down node QB to a high level. In a case where the level of the first pull-up node Q1 is a high level, the ninth transistor M9 is turned on. For example, in the design of the transistor, the ninth transistor M9 and the seventh transistor M7 (or the eighth transistor M8) can be configured that (for example, the size ratio, the threshold voltage, etc.) in a case where both M9 and M7 (or M8) are turned on, the level of the pull-down node QB can be pulled down to a low level, which can cause the tenth transistor M10, the eleventh transistor M11 and the twelfth transistor M12 to maintain being turned off.

As illustrated in FIG. 8, the pull-down circuit 500 can be implemented to include a tenth transistor M10, an eleventh transistor M11, and a twelfth transistor M12. A gate electrode of the tenth transistor M10 is connected to the pull-down node QB, a first electrode of the tenth transistor M10 is connected to the first pull-up node Q1, and a second electrode of the tenth transistor M10 is connected to the fifth voltage terminal VGL2 to receive the fifth voltage. A gate electrode of the eleventh transistor M11 is connected to the pull-down node QB, a first electrode of the eleventh transistor M11 is connected to the shift signal output terminal CR, and a second electrode of the eleventh transistor M11 is connected to the fifth voltage terminal VGL2 to receive the fifth voltage. A gate electrode of the twelfth transistor M12 is connected to the pull-down node QB, a first electrode of the twelfth transistor M12 is connected to the pixel scanning signal output terminal OUT, and a second electrode of the twelfth transistor M12 is connected to a sixth voltage terminal VGL3 to receive a sixth voltage. It should be noted that, in the embodiments of the present disclosure, the sixth voltage terminal VGL3 can be configured to, for example, provide a DC low-level signal, that is, the sixth voltage is a low level, which are the same in the following embodiments and will not be described again.

For example, when the level of the pull-down node QB is a high level, the tenth transistor M10, the eleventh transistor M11, and the twelfth transistor M12 are turned on, so that the level of the first pull-up node Q1 and the level of the shift signal output terminal CR can be pulled down to reduce noise by using the low-level fifth voltage, and the level of the pixel scanning signal output terminal OUT can be pulled down to reduce noise by using the low-level sixth voltage.

It should be noted that, in the embodiments of the present disclosure, for example, the low-level signal input by the first voltage terminal VGL1, the low-level signal input by the fifth voltage terminal VGL2, and the low-level signal input by the sixth voltage terminal VGL3 can be the same, that is, the above three voltage terminals can be connected to a same signal line to receive a same low-level signal. For another example, the above three voltage terminals can be connected to different signal lines to receive different low-level signals, respectively. The embodiments of the present disclosure do not limit the manners in which the first voltage terminal VGL1, the fifth voltage terminal VGL2, and the sixth voltage terminal VGL3 are disposed.

As illustrated in FIG. 8, the second pull-down control circuit 600 can be implemented as a thirteenth transistor M13. A gate electrode of the thirteenth transistor M13 is connected to the first clock signal terminal CLKA to receive the first clock signal, a first electrode of the thirteenth transistor M13 is connected to the pull-down node QB, and a second electrode of the thirteenth transistor M13 is connected to the fifth voltage terminal VGL2 to receive the fifth voltage. For example, in a blanking phase of one frame, when the first clock signal is at a high level, the thirteenth transistor M13 is turned on, so that the pull-down node QB can be pulled down by using the low-level fifth voltage.

For example, in some other examples, as illustrated in FIG. 8, the second pull-down control circuit 600 further includes a seventeenth transistor M17. A gate electrode of the seventeenth transistor M17 is electrically connected to the pull-up control node H, a first electrode of the seventeenth transistor M17 is connected to the second electrode of the thirteenth transistor M13, and a second electrode of the seventeenth transistor M17 is connected to the fifth voltage terminal VGL2 to receive the fifth voltage.

For example, in a blanking phase of one frame, when the level of the first clock signal and the level of the pull-up control node H are both a high level, the thirteenth transistor M13 and the seventeenth transistor M17 are both turned on, which can cause the pull-down node QB to be electrically connected to the fifth voltage terminal VGL2, so that the level of the pull-down node QB can be pulled down to a low level by using the low-level fifth voltage.

As illustrated in FIG. 8, the third pull-down control circuit 700 can be implemented as a fourteenth transistor M14. A gate electrode of the fourteenth transistor M14 is connected to the display input signal terminal STU2 to receive the first display input signal, a first electrode of the fourteenth transistor M14 is connected to the pull-down node QB, and a second electrode of the fourteenth transistor M14 is connected to the fifth voltage terminal VGL2 to receive the fifth voltage. For example, in a display phase of one frame, the fourteenth transistor M14 can be turned on in response to the first display input signal, so as to pull down the level of the pull-down node QB by using the low-level fifth voltage. Pulling down the level of the pull-down node QB to a low level can avoid the influence of the level of the pull-down node QB on the level of the first pull-up node Q1, so that the fourth transistor M4 can charge the first pull-up node Q1 more sufficiently during the display phase.

For example, in a case where a plurality of input-output units are cascaded, the display input signal terminal STU2 of each stage of the input-output units may be electrically connected to the shift signal output terminal CR of a previous second-stage input-output unit. That is, the first display input signal may be a signal output by the shift signal output terminal CR of the previous second-stage input-output unit.

As illustrated in FIG. 8, the display reset circuit 800 can be implemented as a fifteenth transistor M15. A gate electrode of the fifteenth transistor M15 is connected to the display reset signal terminal STD to receive the display reset signal, a first electrode of the fifteenth transistor M15 is connected to the first pull-up node Q1, and a second electrode of the fifteenth transistor M15 is connected to the fifth voltage terminal VGL2 to receive the fifth voltage. For example, during a display phase of one frame, the fifteenth transistor M15 can be turned on in response to the display reset signal, so that the first pull-up node Q1 can be reset by using the low-level fifth voltage. For example, in a case where a plurality of input-output units are cascaded, the display reset signal terminal STD of each stage of the input-output units may be electrically connected to the shift signal output terminal CR of a next third-stage input-output unit. That is, the display reset signal may be a signal output by the shift signal output terminal CR of the next third-stage input-output unit.

As illustrated in FIG. 8, the total reset circuit 900 can be implemented as a sixteenth transistor M16. A gate electrode of the sixteenth transistor M16 is connected to the total reset signal terminal TRST to receive the total reset signal, a first electrode of the sixteenth transistor M16 is connected to the first pull-up node Q1, and a second electrode of the sixteenth transistor M16 is connected to the fifth voltage terminal VGL2 to receive the fifth voltage. For example, in a case where a plurality of input-output units are cascaded, before a display phase of one frame, the sixteenth transistor M16 in each stage of the input-output units is turned on in response to the total reset signal, so that the first pull-up node Q1 can be reset by using the low-level fifth voltage, thereby implementing the total reset for each stage of the input-output units.

Figure 9:
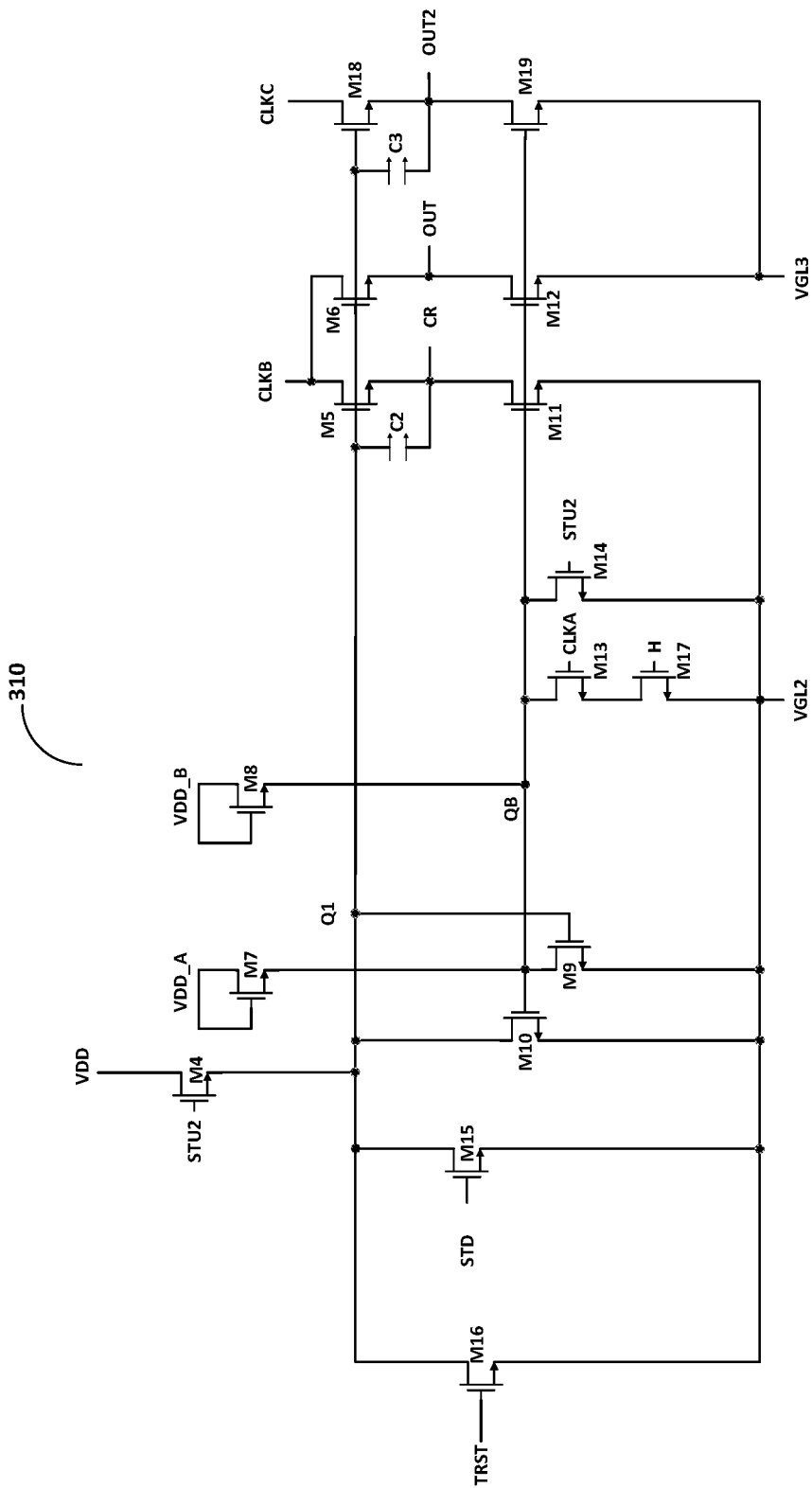
FIG. 9 is a circuit diagram of another first input-output unit provided by some embodiments of the present disclosure.

As illustrated in FIG. 9, some other embodiments of the present disclosure further provide a first input-output unit 310. Compared the first input-output unit 310 as illustrated in FIG. 9 with the first input-output unit 310 as illustrated in FIG. 8, the output circuit 300 further includes an eighteenth transistor M18 and a third capacitor C3, and accordingly, the pull-down circuit 500 further includes a nineteenth transistor M19.

As illustrated in FIG. 9, a gate electrode of the eighteenth transistor M18 is connected to the first pull-up node Q1, a first electrode of the eighteenth transistor M18 is connected to a third clock signal terminal CLKC to receive a third clock signal, and a second electrode of the eighteenth transistor M18 is connected to another pixel scanning signal output terminal OUT2. A first electrode of the third capacitor C3 is connected to the first pull-up node Q1, and a second electrode of the third capacitor C3 is connected to the second electrode of the eighteenth transistor M18. For example, when the level of the first pull-up node Q1 is a high level, the eighteenth transistor M18 is turned on, so that the third clock signal is output to the pixel scanning signal output terminal OUT2. For example, in one example, the third clock signal input from the third clock signal terminal CLKC may be configured to be the same as the second clock signal input from the second clock signal terminal CLKB; and for another example, the third clock signal can further be configured to be different from the second clock signal, so that the two pixel scanning signal output terminals OUT and OUT2 can respectively output different signals, thereby improving the driving capability of the shift register unit and increasing the diversity of output signals.

It should be noted that in the example as illustrated in FIG. 9, the holding capability of the level of the first pull-up node Q1 can be improved by setting the third capacitor C3. Of course, the third capacitor C3 may not be provided, and the embodiments of the present disclosure do not limit this.

As illustrated in FIG. 9, a gate electrode of the nineteenth transistor M19 is connected to the pull-down node QB, a first electrode of the nineteenth transistor M19 is connected to the pixel scanning signal output OUT2, and a second electrode of the nineteenth transistor M19 is connected to the sixth voltage terminal VGL3. For example, when the level of the pull-down node QB is a high level, the nineteenth transistor M19 is turned on, so that the level of the pixel scanning signal output terminal OUT2 can be pulled down and reset by using the low-level sixth voltage. It should be noted that, the second electrode of the nineteenth transistor M19 can further be configured to be connected to other signal terminals, as long as the pixel scanning signal output terminal OUT2 can be pulled down and reset, which is not limited in the embodiments of the present disclosure.

As described above, in the shift register units 10 provided by the embodiments of the present disclosure, the level of the pull-up control node H can be maintained by the first capacitor C1, and the level of the first pull-up node Q1 can be maintained by the second capacitor C2. The first capacitor C1 and/or the second capacitor C2 may be a capacitor component fabricated by a manufacturing process, for example, by fabricating a dedicated capacitor electrode. Each electrode of the capacitor may be implemented by a metal layer, a semiconductor layer (e.g., doped polysilicon) and the like. And in some examples, by designing circuit wiring parameters, the first capacitor C1 and/or the second capacitor C2 can further be implemented by parasitic capacitance between the various components. The connection manner of the first capacitor C1 and/or the second capacitor C2 is not limited to the manner described above, and may be other suitable connection manners as long as the level provided to the pull-up control node H or the first pull-up node Q1 can be stored.

In a case where the level of the first pull-up node Q1 and/or the level of the pull-up control node H is maintained at a high level, the first electrodes of some transistors (for example, the first transistor M1, the tenth transistor M10, the fifteenth transistor M15, the sixteenth transistor M16, and the first transmission transistor TM1) are connected to the first pull-up node Q1 or the pull-up control node H, and the second electrodes thereof are connected to a low-level signal. Even in a case where gate electrodes of these transistors are input with turn-off signals, because there is a voltage difference between the first electrode and the second electrode, leakage current may occur, thereby causing the effect of maintaining the level of the pull-up node Q1 and/or the level of the pull-up control node H in the shift register unit 10 to get worse.

For example, as illustrated in FIG. 5, taking the pull-up control node H as an example, the first electrode of the first transistor M1 is connected to the blanking input signal terminal STU1, and the second electrode of the first transistor M1 is connected to the pull-up control node H. In a case where the level of the pull-up control node H is a high level and the signal input by the blanking input signal terminal STU1 is at a low level, the pull-up control node H may leak current through the first transistor M1.

Figure 10:
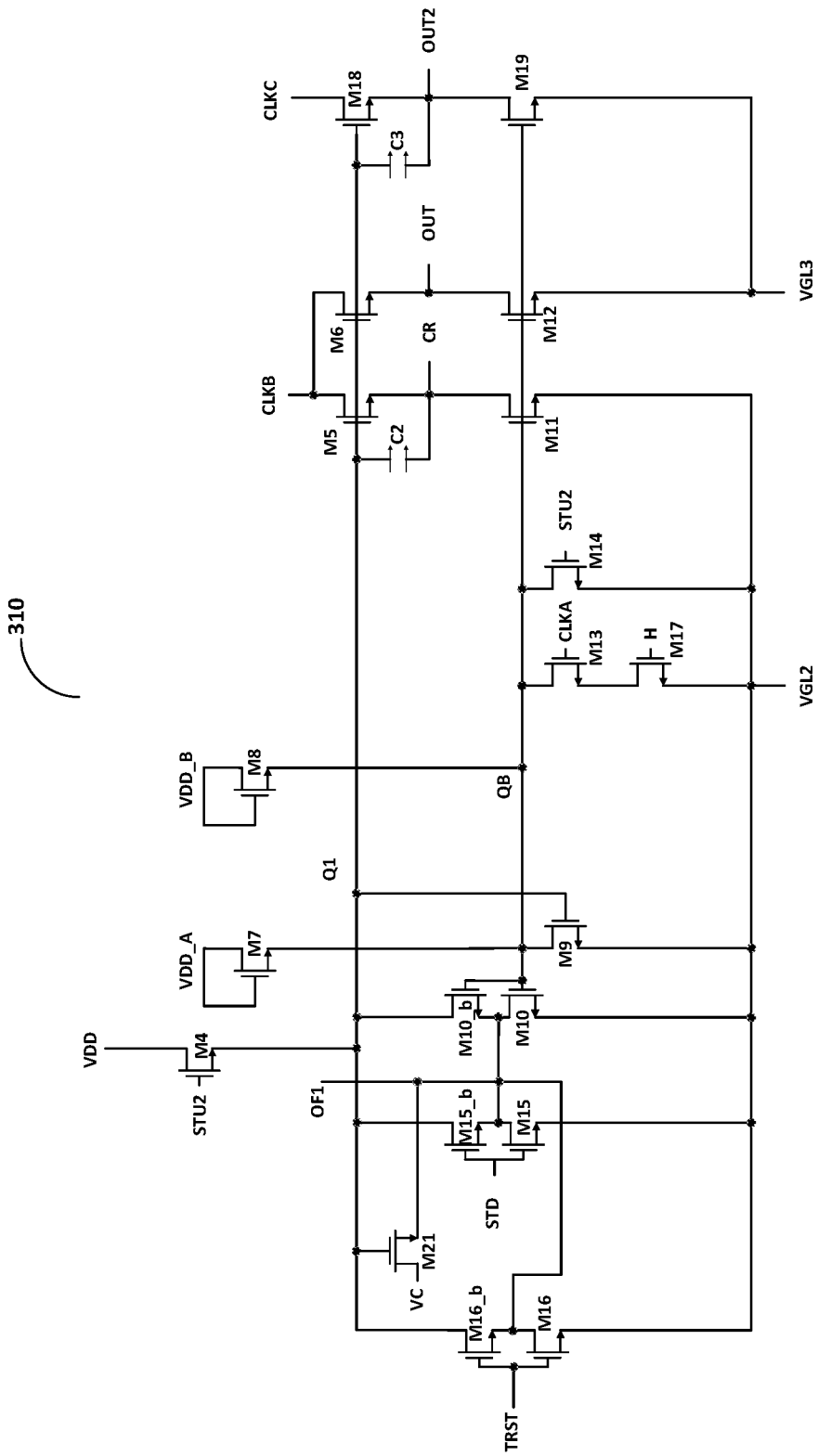
FIG. 10 is a circuit diagram of another first input-output unit provided by some embodiments of the present disclosure.

In response to the above problems, as illustrated in FIG. 7 and FIG. 10, some embodiments of the present disclosure also provide a circuit structure having a leakage preventing structure. As illustrated in FIG. 7 and FIG. 10, the transistors M1_b, MT1_b, MT2_b, M10_b, M15_b, M16_b, M20, and M21 are provided. In the following, the transistor M1_b will be taken as an example to describe the working principle of leakage prevention.

A gate electrode of the transistor M1_b is connected to the gate electrode of the first transistor M1, a first electrode of the transistor M1_b is connected to a second electrode of the transistor M20, and a second electrode of the transistor M1_b is connected to the pull-up control node H. A gate electrode of the transistor M20 is connected to the pull-up control node H, and a first electrode of the transistor M20 is connected to a seventh voltage terminal VB to receive a high-level seventh voltage. In a case where the pull-up control node H is at a high level, the transistor M20 is turned on under control of the level of the pull-up control node H, so that the high-level signal input by the seventh voltage terminal VB can be input to the first electrode of the transistor M1_b, and cause both the first electrode of the transistor M1_b and the second electrode of the transistor M1_b to be at a high level, so that the pull-up control node H can be prevented from leaking through the transistor M1_b. At that time, because the gate electrode of the transistor M1_b and the gate electrode of the first transistor M1 are connected, the combination of the first transistor M1 and the transistor M1_b can implement the same effect as the first transistor M1 described above and simultaneously can have an effect of preventing leakage.

Similarly, as illustrated in FIG. 7, corresponding to the first transmission transistor MT1 and the second transmission transistor MT2, the transistor MT1_b and the transistor MT2_b may be respectively provided to implement a leakage preventing structure. A gate electrode of the transistor MT1_b and a gate electrode of the transistor MT2_b are connected to the first clock signal terminal CLKA to receive the first clock signal. The second electrode of the first transmission transistor MT1 and a first electrode of the transistor MT1_b are connected to a first leakage preventing node OF1. As illustrated in FIG. 10, the first leakage preventing node OF1 is electrically connected to the transistor M21 in the first input-output unit 310. The second electrode of the second transmission transistor MT2 and a first electrode of the transistor MT2_b are connected to a second leakage preventing node OF2. The second leakage preventing node OF2 may be electrically connected to a transistor in the second input-output unit 320, for example, to implement an leakage preventing function. Setting the transistor MT1_b can prevent leakage of the first pull-up node Q1, and setting the transistor MT2_b can prevent leakage of the second pull-up node Q2.

Similarly, as illustrated in FIG. 10, the transistors M10_b, M15_b, and the transistor M16_b can implement the leakage preventing structure in combination with the transistor M21, respectively, thereby preventing the first pull-up node Q1 from leaking. For example, a first electrode of the transistor M21 is connected to an eighth voltage terminal VC to receive a high-level eighth voltage. The working principle of preventing leakage at the first pull-up node Q1 is the same as the working principle of preventing leakage at the pull-up control node H described above, and details are not described herein again.

Figure 18:
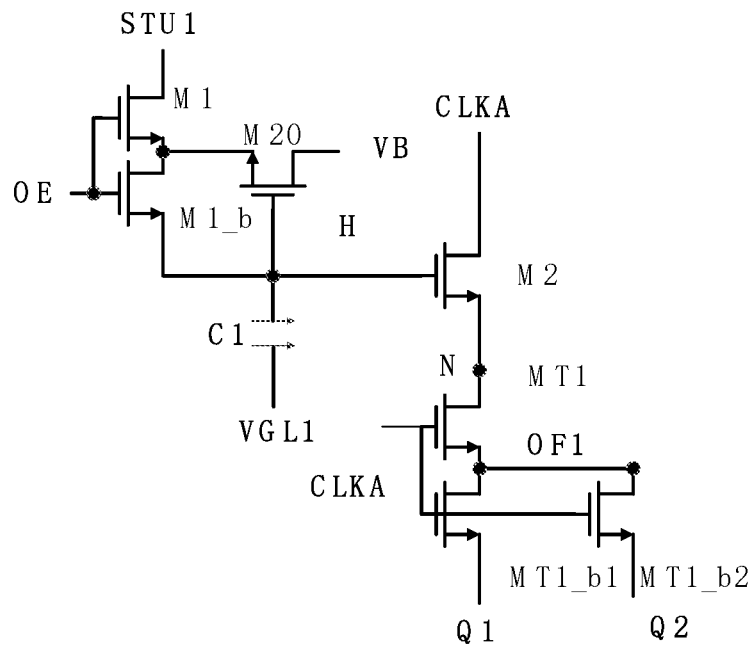
FIG. 18 is further still another circuit diagram including a blanking unit, a first transmission circuit and a second transmission circuit provided by some embodiments of the present disclosure.

FIG. 18 illustrates another circuit structure having a leakage preventing structure according to an embodiment of the present disclosure. Compared with the embodiment shown in FIG. 7, in the embodiment shown in FIG. 18, similarly, the first electrode of the second transistor M2 is connected to the first clock signal terminal CLKA to receive the first clock signal as an input. The circuit no longer includes the capacitor CST and transistor M3 for blanking pull-up. On the other hand, the first pull-up node Q1 and the second pull-up node Q2 are both driven by the transistor MT1 that is regarded as a common transmission transistor, and the transistor MT1_b1 and the transistor MT1_b2 for preventing leakage are respectively connected to the first pull-up node Q1 and the second pull-up node Q2.

Of course, those skilled in the art can understand that in the embodiment shown in FIG. 18, the transistor M3 and the capacitor CST for blanking pull-up can be added as needed, more pull-up nodes (such as the third pull-up node, the fourth pull-up node, etc.) driven by the transmission transistor MT1 can also be added, and embodiments of the present disclosure are not limited to the case shown in FIG. 18. The working principle of leakage prevention in this embodiment will be explained below.

The combination of the first transistor M1 and the transistor M1_b has the effect of preventing leakage, which will not be repeated here.

As shown in FIG. 18, corresponding to the transmission transistor MT1, the transistor MT1_b1 and the transistor MT1_b2 are provided to realize the leakage preventing structure. Here, the transmission transistor MT1 is an example of the common transmission circuit, the transistor MT1_b1 is an example of the first transmission circuit, and the transistor MT1_b2 is an example of the second transmission circuit. The gate electrode of the transistor MT1_b1 and the gate electrode of the transistor MT1_b2 are both connected to the first clock signal terminal CLKA to receive the first clock signal, and the second electrode of the transmission transistor MT1, the first electrode of the transistor MT1_b1, and the first electrode of the transistor MT1_b2 are all connected to the first leakage preventing node OF1. Therefore, the first electrode of the transistor MT1_b1 and the first electrode of the transistor MT1_b2 are electrically connected with the blanking pull-up node N through the common transmission transistor being turned on in operation. Similarly, in the embodiment shown in FIG. 10, the first leakage preventing node OF1 is electrically connected with the transistor M21 in the first input-output unit 310. In addition, for example, the first leakage preventing node OF1 may also be electrically connected with the transistor in the second input-output unit 320 to realize the leakage preventing function. The transistor MT1_b1 is provided to prevent electric leakage of the first pull-up node Q1, and the transistor MT1_b2 is provided to prevent electric leakage of the second pull-up node Q2.

Figure 11:
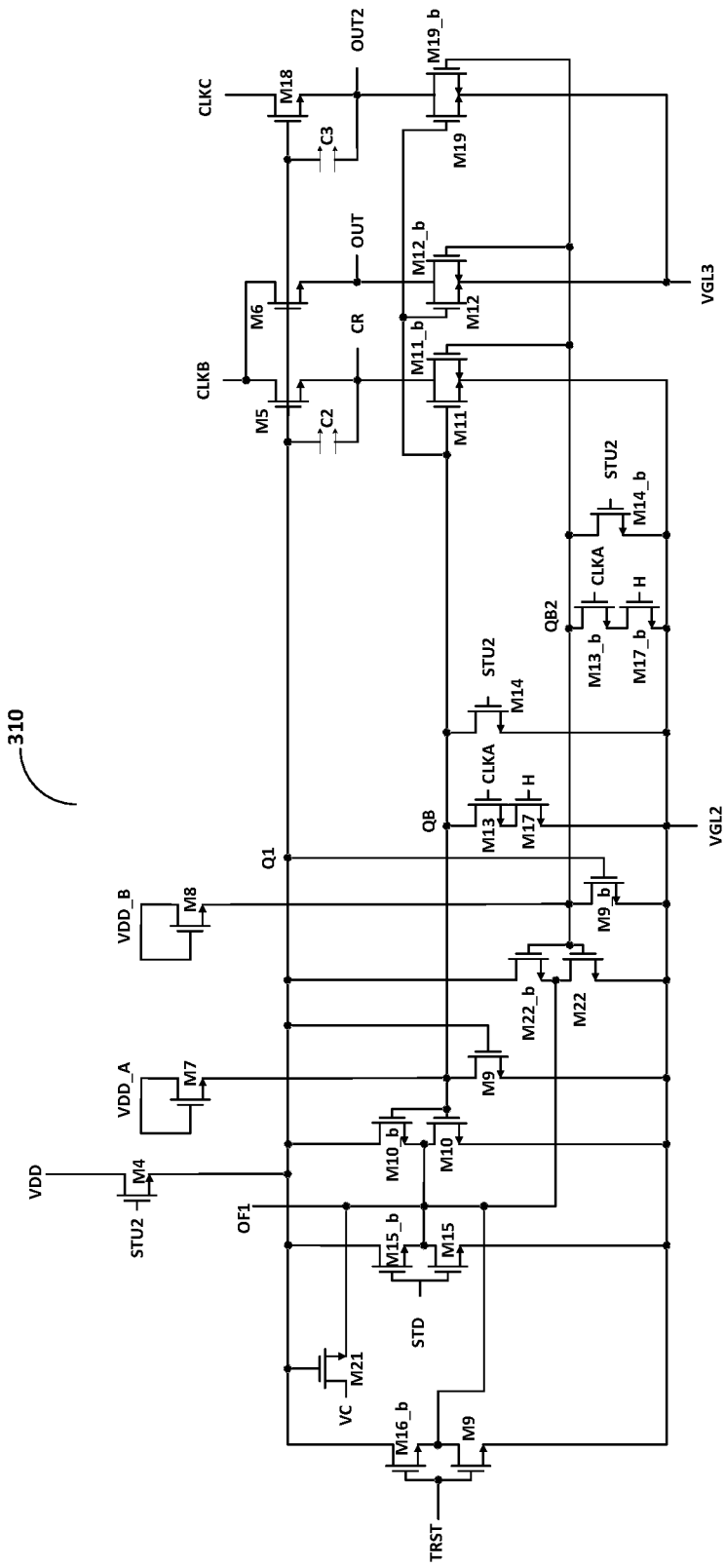
FIG. 11 is a circuit diagram of further still another first input-output unit provided by some embodiments of the present disclosure.

As illustrated in FIG. 11, some other embodiments of the present disclosure further provide another first input-output unit 310. Compared the first input-output unit 310 as illustrated in FIG. 11 with the first input-output unit 310 as illustrated in FIG. 10, a second pull-down node QB2 is added. In order to work with the second pull-down node QB2, transistors M22, M22_b, M9_b, M13_b, M17_b, M14_b, M11_b, M12_b, and M19_b are added accordingly. It should be noted that the second electrode of the eighth transistor M8 is no longer connected to the pull-down node QB, but is connected to the second pull-down node QB2. The transistor M22_b is a leakage preventing transistor provided to prevent the first pull-up node Q1 from leaking.

In the first input-output unit 310 as illustrated in FIG. 11, the working principles of the transistors M22, M22_b, and M9_b are respectively similar to the working principles of the transistors M10, M10_b, and M9. The working principles of the transistors M13_b, M17_b, and M14_b are respectively similar to the working principles of the transistors M13, M17, and M14. The working principles of the transistors M11_b, M12_b, and M19_b are respectively similar to the working principles of the transistors M11, M12, and M19, and details are not described herein again.

Figure 19:
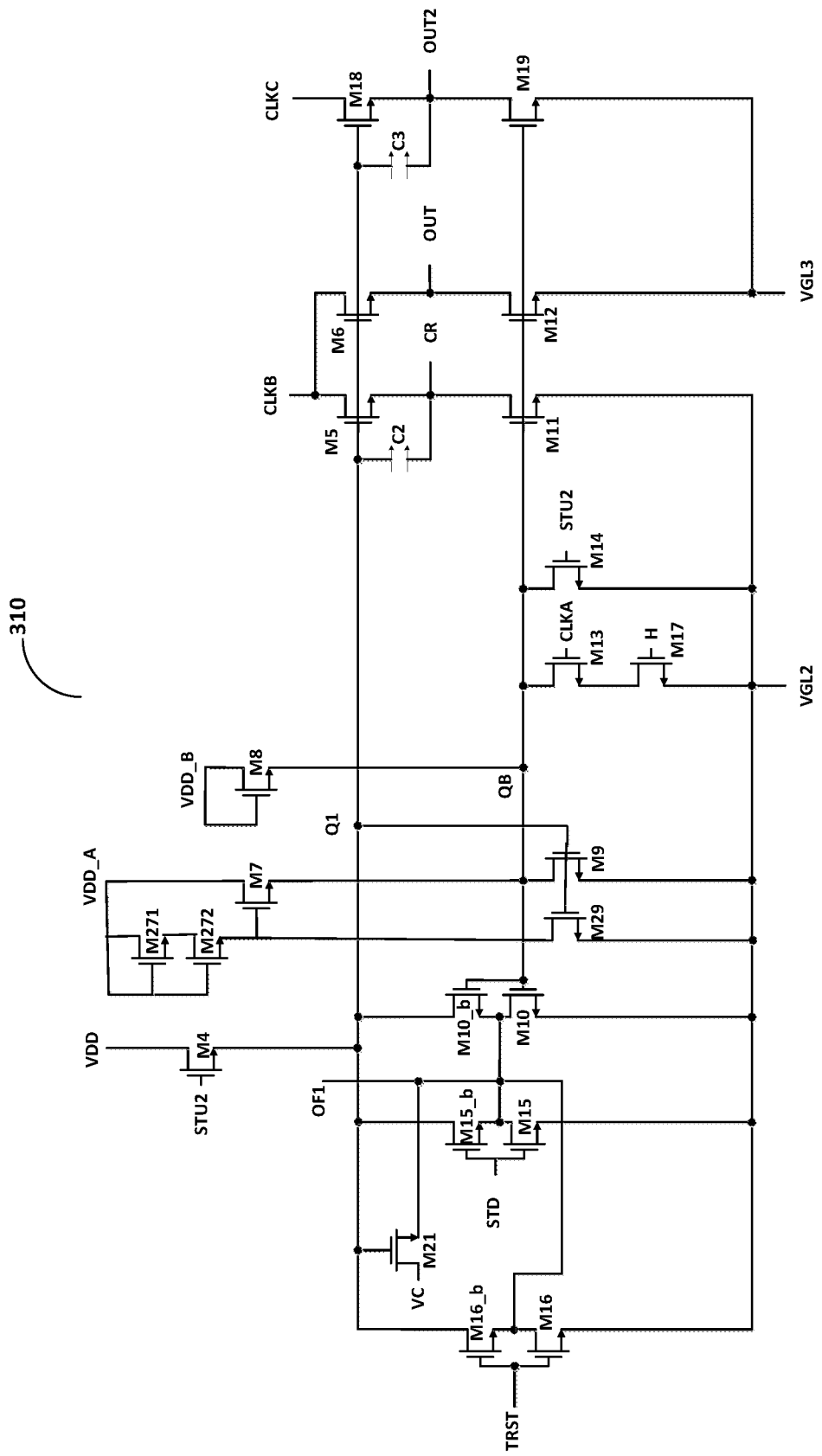
FIG. 19 is a circuit diagram of another first input-output unit provided by some embodiments of the present disclosure.

As illustrated in FIG. 19, another embodiment of the present disclosure further provides a first input-output unit 310. Compared with the first input-output unit 310 as illustrated in FIG. 10, the first input-output unit 310 as illustrated in FIG. 19 comprises a first pull-down auxiliary control circuit that is additionally provided. The first pull-down auxiliary control circuit is connected between the third voltage terminal VDD_A and the fifth voltage terminal VGL2, and comprises a transistor M271, a transistor M272 and a transistor M29.

A gate electrode of the transistor M29 is connected to the first pull-up node Q1, a first electrode of the transistor M29 is connected to the gate electrode of the transistor M7, and a second electrode of the transistor M29 is connected to the fifth voltage terminal VGL2 to receive the fifth voltage. Both the gate electrode of the transistor M271 and the gate electrode of the transistor M272 are connected to the third voltage terminal VDD_A to receive the third voltage, so that transistors M271 and M272 are always turned on under the control of the ground voltage. Transistors M271 and M272 are connected in series between the gate electrode of the transistor M7 and the third voltage terminal VDD_A to form a switching circuit together. For example, the first electrode of the transistor M271 is connected to the third voltage terminal VDD_A to receive the third voltage, the second electrode of the transistor M271 and the first electrode of the transistor M272 are connected to each other, and the second electrode of the transistor M272 is connected to the gate electrode of the transistor M7 and thus further connected to the first electrode of the transistor M29.

The on-resistance of at least one of the transistor M271 and the transistor M272 is set to be larger than (e.g., much larger than) the on-resistance of the transistor M29. When the first pull-up node Q1 is pulled up to a high potential (that is, when the pull-down node QB is pulled down to a low potential), the transistor M9 and the transistor M29 are in the turn-on state, which makes the level of the gate electrode of the transistor M7 pulled down by the fifth voltage terminal VGL2 and makes the transistor M7 in a turn-off state. Thereby, it can avoid the third voltage of the third voltage terminal VDD_A from being written into the pull-down node QB through the transistor M7, that is, avoid the interference of the third voltage of the third voltage terminal VDD_A to the potential of the pull-down node QB.

In one modified example of the embodiments as illustrated in FIG. 19, the transistors M271 and M272 can be replaced by one transistor connected between the gate electrode of the transistor M7 and the third voltage terminal VDD_A (as a switching circuit). For example, one of the transistors M271 and M272 can be omitted, such as the transistor M272 is omitted. At this time, the on-resistance of the one transistor is still larger than (e.g., much larger than) the on-resistance of the transistor M29, which can also avoid the interference of the third voltage of the third voltage terminal VDD_A to the potential of the pull-down node QB.

The above-mentioned embodiment shown in FIG. 19 is a modification of the embodiment of FIG. 10, and similarly, a similar modification (not shown) can be made to the embodiment shown in FIG. 11. In the embodiment shown in FIG. 11, for the transistors M7 and M9 controlling the pull-down node QB, the first pull-down auxiliary control circuit as illustrated in FIG. 19, for example, the transistor M271 (and/or the transistor M272) and the transistor M29, can be added, in order to avoid the interference of the third voltage of the third voltage terminal VDD_A to the potential of the pull-down node QB. For the transistors M8 and M9_b controlling the second pull-down node QB2, a second pull-down auxiliary control circuit can be similarly added. The second pull-down auxiliary control circuit can be provided with reference to the transistor M271 (and/or the transistor M272) and the transistor M29 as illustrated in FIG. 19, but is connected between the fourth voltage terminal VDD_B and the fifth voltage terminal VGL2, so as to avoid the interference of the fourth voltage of the fourth voltage terminal VDD_B to the potential of the second pull-down node QB2.

For another example, in the embodiment shown in FIG. 11, the first pull-down auxiliary control circuit shown in FIG. 19 may be added only for the transistors M7 and M9 that control the pull-down node QB, or the second pull-down auxiliary control circuit may be added only for the transistors M8 and M9_b that control the second pull-down node QB. The embodiments of the present disclosure do not limit how to add the pull-down auxiliary control circuit or pull-down auxiliary control circuits.

In the shift register unit 10 provided by the embodiment of the present disclosure, by providing the second pull-down node QB2 and the corresponding transistors, the performance of the shift register unit 10 can be further improved. For example, when charging the first pull-up node Q1, the level of the pull-down node QB and the level of the second pull-down node QB2 can be better at a low level, so as not to affect the level of the first pull-up node Q1, and to ensure the charging of the first pull-up node Q1 more sufficient. For another example, in a case where the shift register unit 10 does not need to output, the noises of the first pull-up node Q1 and the output terminals (CR, OUT, OUT2) can be further reduced to avoid the abnormal output.

Figure 12:
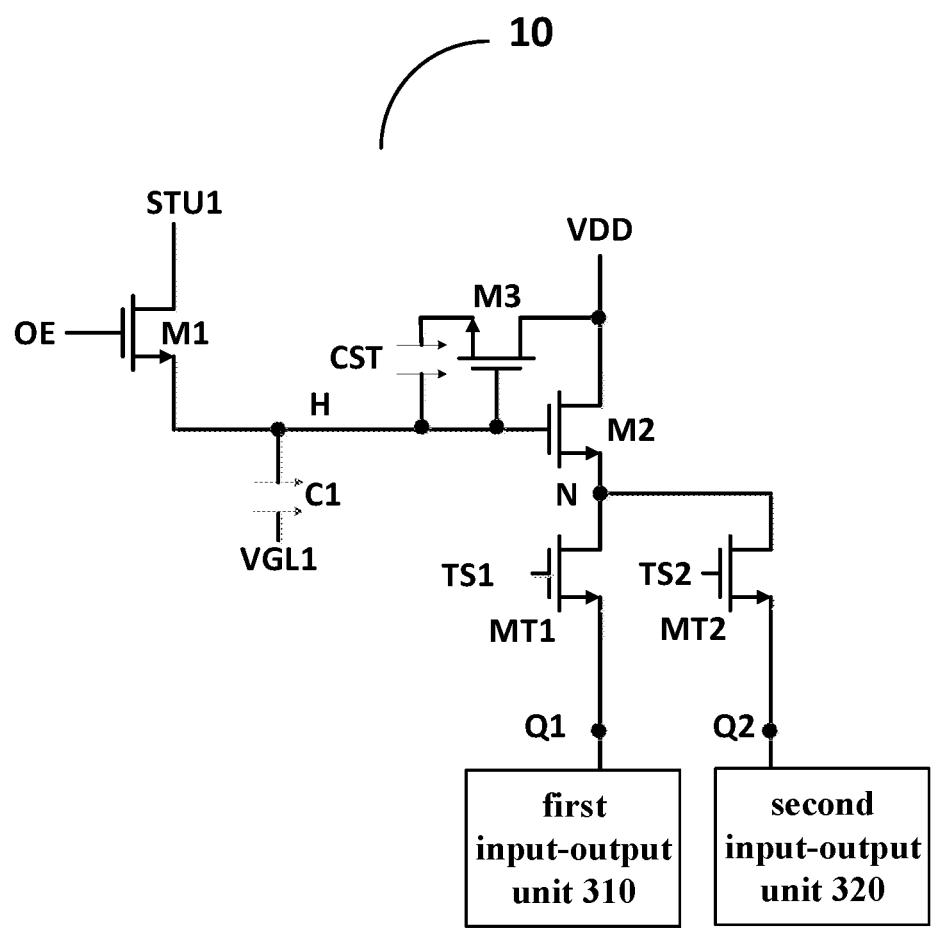
FIG. 12 is a circuit diagram of a shift register unit provided by some embodiments of the present disclosure.

FIG. 12 illustrates a shift register unit 10 according to an embodiment of the present disclosure. The first transmission transistor MT1 is connected to the first input-output unit 310 through the first pull-up node Q1, and the second transmission transistor MT2 is connected to the second input-output unit 320 through the second pull-up node Q2. For example, the first input-output unit 310 in FIG. 12 may adopt any one of the first input-output units provided by the embodiments of the present disclosure. For example, the first input-output unit 310 may adopt any circuit structure as illustrated in FIG. 8, FIG. 9, FIG. 10, and FIG. 11. It should be noted that, the circuit structure of the first input-output unit 310 is described in the embodiment of the present disclosure, and the circuit structure of the second input-output unit 320 may be the same as the circuit structure of the first input-output unit 310. The embodiments of the present disclosure include but are not limited to this, for example, the circuit structure of the second input-output unit 320 may be different from the circuit structure of the first input-output unit 310 as long as corresponding functions can be implemented.

It should be noted that each of the transistors used in the embodiments of the present disclosure may be a thin film transistor, a field effect transistor or other switching component having the same characteristics. In the embodiments of the present disclosure, the thin film transistor is taken as an example for description. The source electrode and drain electrode of the transistor used here may be structurally symmetrical, so that the source electrode and the drain electrode may be structurally indistinguishable. In the embodiments of the present disclosure, in order to distinguish the two electrodes of the transistor except the gate electrode, one electrode is directly described as the first electrode, and the other electrode is described as the second electrode. In addition, the transistors can be divided into N-type and P-type transistors according to the characteristics of the transistors. In a case where the transistor is the P-type transistor, the turn-on voltage is a low level voltage (e.g., 0V, −5V, −10V, or other suitable voltage), and the turn-off voltage is a high level voltage (e.g., 5V, 10V, or other suitable voltage). In a case where the transistor is the N-type transistor, the turn-on voltage is a high level voltage (for example, 5V, 10V or other suitable voltage), and the turn-off voltage is a low level voltage (for example, 0V, −5V, −10V or other suitable voltage).

In addition, it should be noted that the transistors used in the shift register unit 10 provided by the embodiments of the present disclosure are all described by taking the N-type transistor as an example. The embodiments of the present disclosure include but are not limited thereto, and for example, at least some of the transistors in the shift register unit 10 may also use the P-type transistor.

Figure 13:
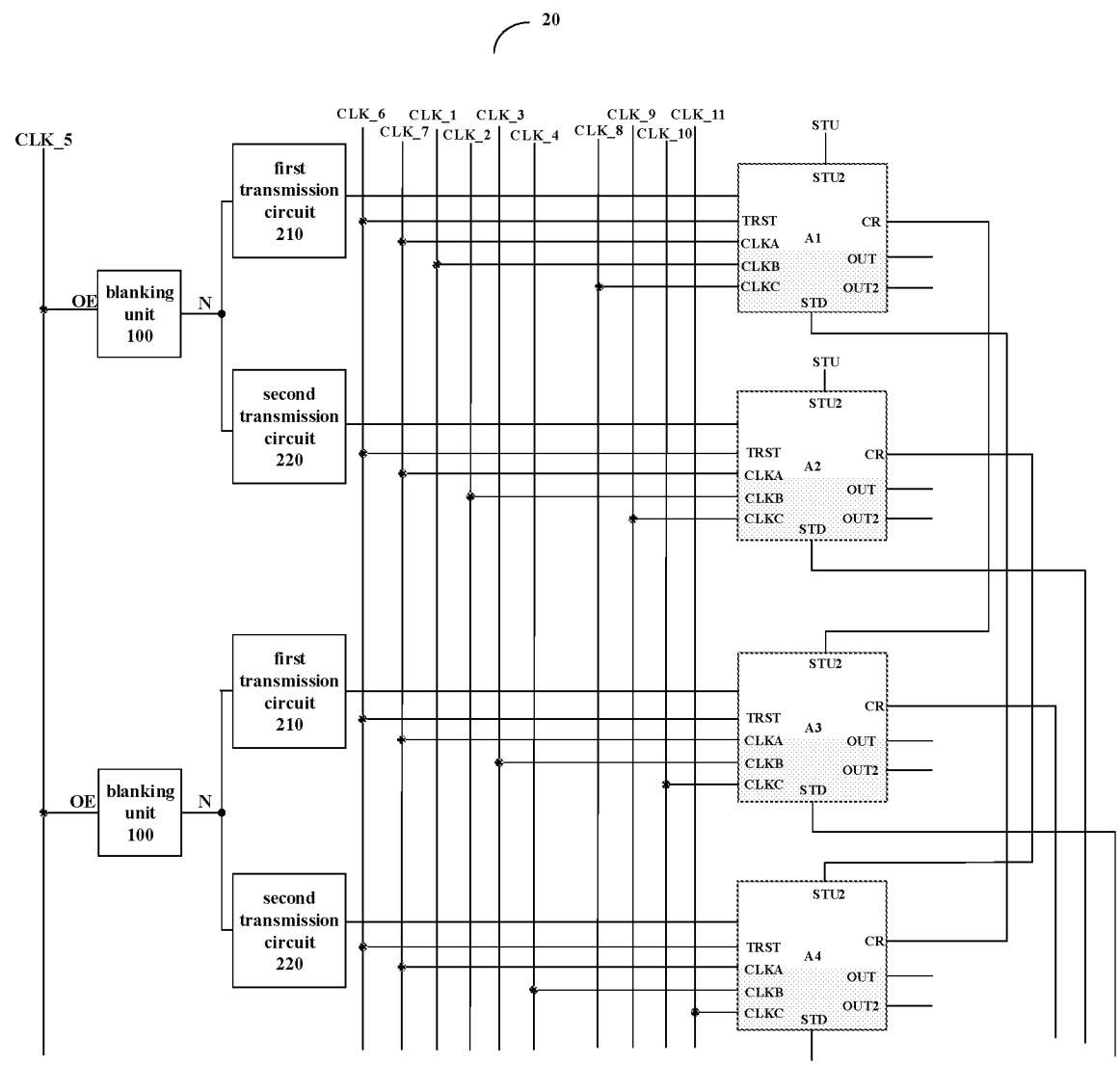
FIG. 13 is a schematic diagram of a gate driving circuit provided by some embodiments of the present disclosure.

Some embodiments of the present disclosure further provide a gate driving circuit 20. As illustrated in FIG. 13, the gate driving circuit 20 includes a plurality of cascaded shift register units 10, and any one or more of the shift register units 10 can adopt the structure of the shift register unit 10 provided by the embodiment of the present disclosure or a modification thereof. A1, A2, A3, and A4 in FIG. 13 represent the input-output units, for example, the four input-output units can all adopt the circuit structure in FIG. 9. It should be noted that, in the embodiments of the present disclosure, the cascade of the shift register unit 10 means that the input-output units in the shift register unit 10 are cascaded, and the blanking units in different shift register units 10 are not cascaded.

For example, as illustrated in FIG. 13, each shift register unit 10 includes two input-output units. In a case where the gate driving circuit 20 is used to drive a display panel, the output terminal of each input-output unit may be electrically connected to one row of sub-pixel units in the display panel, respectively. For example, the input-output units A1, A2, A3, and A4 may be electrically connected to a first row, a second row, a third row, and a fourth row of sub-pixel units, respectively.

It should be noted that, in the gate driving circuit 20 as illustrated in FIG. 13, the two input-output units in the shift register unit 10 are adjacent, that is, for driving adjacent rows of the sub-pixel units in the display panel. The embodiments of the present disclosure include, but are not limited to this, for example, one of the shift register units 10 may include an input-output unit A1 and an input-output unit A3, and the other shift register unit 10 may include an input-output unit A2 and an input-output unit A4. That is, the two input-output units included in the shift register unit 10 may be not adjacent.

Figure 14:
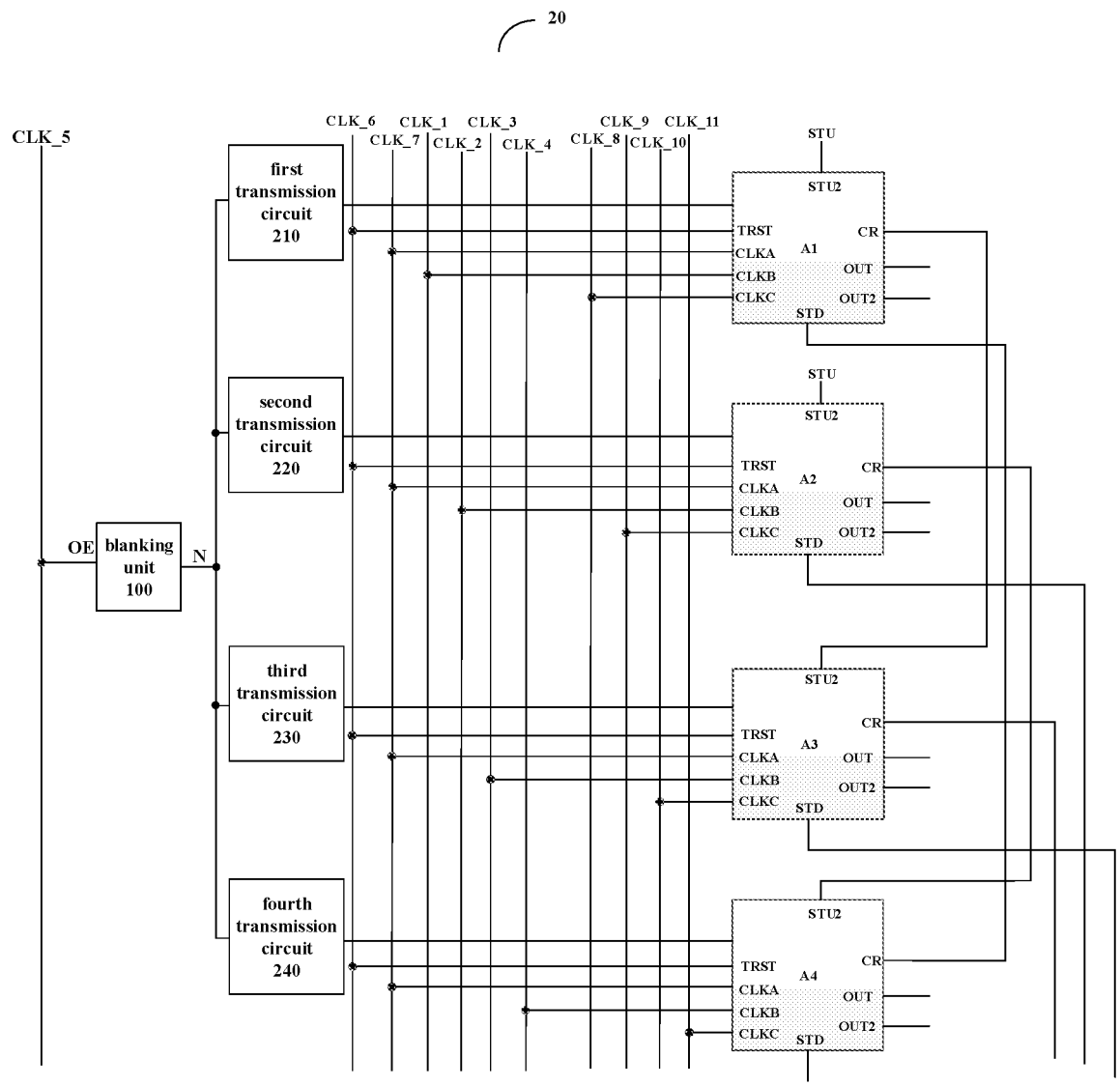
FIG. 14 is a schematic diagram of another gate driving circuit provided by some embodiments of the present disclosure.

For example, in some other embodiments, as illustrated in FIG. 14, the shift register unit 10 may further include four input-output units (A1, A2, A3, and A4), and the four input-output units are electrically connected to the blanking unit 100 through the first transmission circuit 210, the second transmission circuit 220, the third transmission circuit 230, and the fourth transmission circuit 240, respectively.

The gate driving circuit provided in the embodiments of the present disclosure can share a blanking unit, so that the display device using the gate driving circuit can reduce the size of the bezel and reduce the cost.

The following uses the gate driving circuit 20 as illustrated in FIG. 14 as an example to describe signal lines in the gate driving circuit 20.

As illustrated in FIG. 14, the gate driving circuit 20 further includes a first sub-clock signal line CLK_1, a second sub-clock signal line CLK_2, a third sub-clock signal line CLK_3, and a fourth sub-clock signal line CLK_4. A (4n-3)th-stage input-output unit is connected to the first sub-clock signal line CLK_1 to receive the second clock signal, and for example, the (4n-3)th-stage input-output unit is connected to the first sub-clock signal line CLK_1 through the second clock signal terminal CLKB. A (4n-2)th-stage input-output unit is connected to the second sub-clock signal line CLK_2 to receive the second clock signal, and for example, the (4n-2)th-stage input-output unit is connected to the second sub-clock signal line CLK_2 through the second clock signal terminal CLKB. A (4n-1)th-stage input-output unit is connected to the third sub-clock signal line CLK_3 to receive the second clock signal, and for example, the (4n-1)th-stage input-output unit is connected to the third sub-clock signal line CLK_3 through the second clock signal terminal CLKB. A (4n)th-stage input-output unit is connected to the fourth sub-clock signal line CLK_4 to receive the second clock signal, for example, the (4n)th-stage input-output unit is connected to the fourth sub-clock signal line CLK_4 through the second clock signal terminal CLKB, and n is an integer greater than zero.

As described above, the gate driving circuit provided by the embodiment of the present disclosure may adopt a 4CLK clock signal, so that the signal waveforms output by the adjacent input-output units in the gate driving circuit may overlap, for example, thereby increasing pre-charging time. The embodiment of the present disclosure does not limit the type of the clock signal, for example, clock signal such as 6CLK, 8CLK, etc. may also be adopted.

As illustrated in FIG. 14, the gate driving circuit 20 further includes an eighth sub-clock signal line CLK_8, a ninth sub-clock signal line CLK_9, a tenth sub-clock signal line CLK_10, and an eleventh sub-clock signal line CLK_11. In a case where the input-output unit is connected to the third clock signal terminal CLKC, the (4n-3)th-stage input-output unit is connected to the eighth sub-clock signal line CLK_8 to receive the third clock signal, and for example, the (4n-3)th-stage input-output unit is connected to the eighth sub-clock signal line CLK_8 through the third clock signal terminal CLKC. The (4n-2)th-stage input-output unit is connected to the ninth sub-clock signal line CLK_9 to receive the third clock signal, and for example, the (4n-2)th-stage input-output unit is connected to the ninth sub-clock signal line CLK_9 through the third clock signal terminal CLKC. The (4n-1)th-stage input-output unit is connected to the tenth sub-clock signal line CLK_10 to receive the third clock signal, and for example, the (4n-1)th-stage input-output unit is connected to the tenth sub-clock signal line CLK_10 through the third clock signal terminal CLKC. The (4n)th-stage input-output unit is connected to the eleventh sub-clock signal line CLK_11 to receive the third clock signal, for example, the (4n)th-stage input-output unit is connected to the eleventh sub-clock signal line CLK_11 through the third clock signal terminal CLKC, and n is an integer greater than zero.

As illustrated in FIG. 14, the gate driving circuit 20 further includes a fifth sub-clock signal line CLK_5, a sixth sub-clock signal line CLK_6, and a seventh sub-clock signal line CLK_7. Each blanking unit 100 in the gate driving circuit 20 is connected to the fifth sub-clock signal line CLK_5 to receive the compensation selection control signal. For example, each blanking unit 100 in the gate driving circuit 20 is connected to the fifth sub-clock signal line CLK_5 through the compensation selection control terminal OE; each input-output unit is connected to the sixth sub-clock signal line CLK_6 to receive the total reset signal, and for example, each input-output unit is connected to the sixth sub-clock signal line CLK_6 through the total reset signal terminal TRST; and each input-output unit is connected to the seventh sub-clock signal line CLK_7 to receive the first clock signal, and for example, each input-output unit is connected to the seventh sub-clock signal line CLK_7 through the first clock signal terminal CLKA.

As illustrated in FIG. 14, the display input signal terminal STU2 of each stage of the input-output units is electrically connected to the shift signal output terminal CR of the previous second-stage input-output unit, and the display reset signal terminal STD of each stage of the input-output units is electrically connected to the shift signal output terminal CR of the next third-stage input-output unit.

It should be noted that the cascade relationship as illustrated in FIG. 14 is only an example, and according to the description of the present disclosure, other cascade relationships may further be adopted according to the actual situation.

Figure 15:
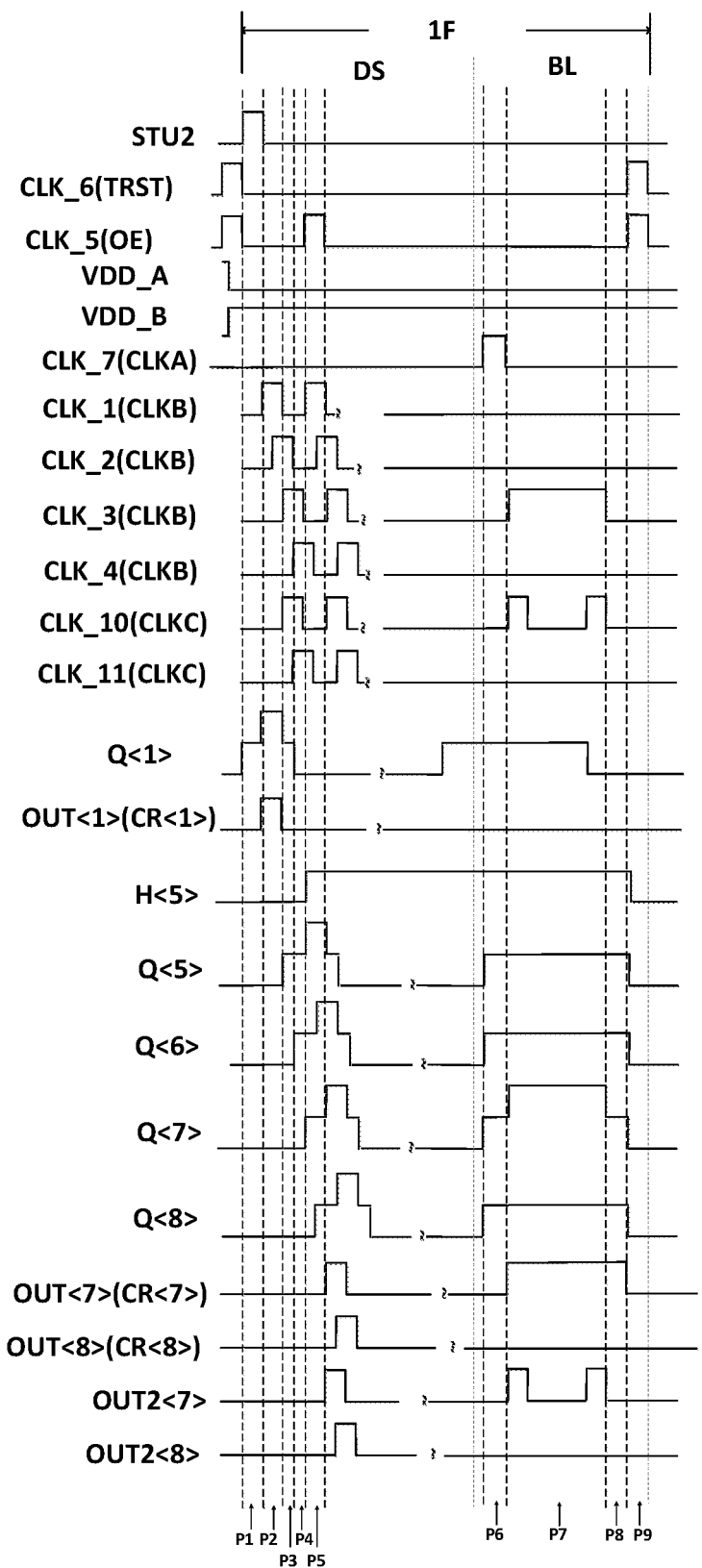
FIG. 15 is a timing diagram of signals corresponding to the gate driving circuit illustrated in FIG. 14 in operation provided by some embodiments of the present disclosure.

For example, in some embodiments, the input-output unit in the gate driving circuit 20 as illustrated in FIG. 14 adopts the circuit structure as illustrated in FIG. 9, and the blanking unit 100 in the gate driving circuit 20 adopts the circuit structure as illustrated in FIG. 6, in this case, FIG. 15 illustrates a timing diagram of signals corresponding to the gate driving circuit as illustrated in FIG. 14 in operation.

In FIG. 15, H<5> represents the pull-up control node H in the blanking unit 100 electrically connected to the fifth-stage input-output unit in the gate driving circuit 20, and Q<1>, Q<5>, Q<6>, Q<7>, and Q<8> respectively represent the pull-up node Q (that is, the first pull-up node Q1 as illustrated in FIG. 9) in the first-stage input-output unit, the fifth-stage input-output unit, the sixth-stage input-output unit, the seventh-stage input-output unit, and the eighth-stage input-output unit of the gate driving circuit 20. OUT<1> (CR<1>), OUT<7> (CR<7>), and OUT<8> (CR<8>) respectively represent the pixel scanning signal output terminal OUT (shift signal output terminal CR) in the first-stage input-output unit, the seventh-stage input-output unit, and the eighth-stage input-output unit of the gate driving circuit 20, and OUT2<7> and OUT2<8> respectively represent the pixel scanning signal output terminal OUT2 in the seventh-stage input-output unit, and the eighth-stage input-output unit of the gate driving circuit 20. 1F represents the first frame, DS represents the display phase in the first frame, and BL represents the blanking phase in the first frame. It should be noted that, STU2 in FIG. 15 represents the display input signal terminal in the first-stage input-output unit.

In addition, it should be noted that as illustrated in FIG. 15, the third voltage terminal VDD_A is input with a low-level voltage, and the fourth voltage terminal VDD_B is input with a high-level voltage, but the embodiments of the present disclosure are not limited thereto. The signal levels in the signal timing diagram as illustrated in FIG. 15 are only illustrative and do not represent real level values.

In the following, the working principle of the gate driving circuit 20 as illustrated in FIG. 14 will be described with reference to the signal timing diagram in FIG. 15.

Prior to the start of the first frame 1F, the fifth sub-clock signal line CLK_5 and the sixth sub-clock signal line CLK_6 provide a high-level signal. Because the compensation selection control terminal OE of each blanking unit 100 is connected to the fifth sub-clock signal line CLK_5, the first transistor M1 in each blanking unit 100 is turned on. At the same time, because the blanking input signal terminal STU1 is input with a low-level signal, the pull-up control node H in each blanking unit 100 can be reset. Because the total reset signal terminal TRST of each blanking unit 100 is connected to the sixth sub-clock signal line CLK_6, the sixteenth transistor M16 in each blanking unit 100 is turned on to reset the pull-up node Q of each blanking unit 100.

Because the fourth voltage terminal VDD_B is input with a high-level signal, the eighth transistor M8 is turned on, the level of the pull-down node QB is charged to a high level. The high level of the pull-down node QB causes the tenth transistor M10 to be turned on, so that the level of the pull-up node Q can be further pulled down to a low level.

In the display phase DS of the first frame 1F, the operation of the first-stage input-output unit is described as follows.

In a first phase P1, the display input signal terminal STU2 of the first-stage input-output unit is input with a high level, and the fourth transistor M4 is turned on. Therefore, the high level input by the second voltage terminal VDD can charge the pull-up node Q<1> through the fourth transistor M4, the level of the pull-up node Q<1> is pulled up to a high level, and the high level of the pull-up node Q<1> can be maintained by the second capacitor C2. The fifth transistor M5 and the sixth transistor M6 are turned on under control of the level of the pull-up node Q<1>, but because the second clock signal terminal CLKB (connected to the first sub-clock signal line CLK1) is input with a low-level signal in the first phase P1, both the shift signal output terminal CR<1> and the pixel scanning signal output terminal OUT<1> output the low-level signal. In the first phase P1, the pre-charging of the pull-up node Q<1> is completed.

In a second phase P2, the second clock signal terminal CLKB is input with a high-level signal, and the level of the pull-up node Q<1> is further pulled up because of a bootstrap effect, so that the fifth transistor M5 and the sixth transistor M6 keep being turned on, and both the shift signal output terminal CR<1> and the pixel scanning signal output terminal OUT<1> output the high-level signal. For example, the high-level signal output by the shift signal output terminal CR<1> can be used for scanning shift of adjacent shift register units (input-output units), and the high-level signal output by the pixel scanning signal output terminal OUT<1> can be used to drive the sub-pixel units in the display panel to perform display.

In a third phase P3, the second clock signal terminal CLKB is input with a low-level signal, at the same time, because the pull-up node Q<1> is maintained at a high level, the fifth transistor M5 and the sixth transistor M6 keep being turned on, and both the shift signal output terminal CR<1> and the pixel scanning signal output terminal OUT<1> output the low-level signal. Due to the bootstrap effect of the second capacitor C2, the level of the pull-up node Q<1> also decreases.

In a fourth phase P4, because the display reset signal terminal STD of the first-stage input-output unit is connected to the shift signal output terminal of the fourth-stage input-output unit, the shift signal output terminal of fourth-stage input-output unit outputs a high-level signal in this phase. Therefore, the display reset signal terminal STD of first-stage input-output unit is input with a high-level signal, the fifteenth transistor M15 is turned on, the level of the pull-up node Q<1> is pulled down to a low level, thereby resetting the pull-up node Q<1>. Because the level of the pull-up node Q<1> is a low level, the ninth transistor M9 is turned off, and the high-level signal input by the fourth voltage terminal VDD_B can charge the pull-down node QB. The level of the pull-down node QB is charged to a high level, so that the tenth transistor M10 is turned on to further perform reset on the pull-up node Q<1>. Simultaneously, the eleventh transistor M11 and the twelfth transistor M12 are turned on, and the level of the shift signal output terminal CR<1> and the level of the pixel scanning signal output terminal OUT<1> are further pulled down to be reset.

After the first-stage input-output unit drives the sub-pixels in the first row in the display panel to complete the display, accordingly, the second-stage input-output unit, the third-stage input-output unit and the like progressively drive the sub-pixel units in the display panel to complete the display driving of one frame. Here, the display phase DS of the first frame 1F ends.

In addition, the pull-up control node H is charged in the display phase DS of the first frame 1F. For example, in a case where the seventh row of sub-pixel units needs to be compensated in the first frame 1F, the display phase DS of the first frame 1F also performs the following operations.

In a fifth phase P5, the fifth sub-clock signal line CLK_5 is provided with the same signal as the shift signal output terminal of the fifth-stage input-output unit. When the shift signal output terminal of the fifth-stage input-output unit outputs a high-level signal, the compensation selection control terminal OE of the blanking unit 100 is input with a high-level signal, and the first transistor M1 is turned on (as illustrated in FIG. 6). In addition, the blanking input signal terminal STU1 may be connected to the shift signal output terminal of the fifth-stage input-output unit, so that the high-level signal input by the blanking input signal terminal STU1 charges the pull-up control node H<5>, thereby pulling the level of the pull-up control node H<5> to a high level.

It should be noted that the above-mentioned charging process for the pull-up control node H<5> is only an example, and the embodiments of the present disclosure include but are not limited thereto. For example, the blanking input signal terminal STU1 of the blanking unit 100 may also be connected to the shift signal output terminal of the third-stage or fourth-stage input-output unit, and in addition, the timing of the signal provided to the fifth sub-clock signal line CLK_5 may be the same as the timing of the signal provided to the blanking input signal terminal STUL.

The high level of the pull-up control node H<5> can be maintained until the blanking phase BL of the first frame 1F. In a case where it is necessary to compensate the seventh row of sub-pixel units in the first frame 1F, the following operations are performed in the blanking phase BL of the first frame 1F.

In a sixth phase P6, the seventh sub-clock signal line CLK_7 provides a high-level signal. Because the first clock signal terminal CLKA is connected to the seventh sub-clock signal line CLK_7, the first clock signal is at a high level in this phase, the four transmission circuits in FIG. 14 are all turned on, and the high-level second voltage can charge the pull-up nodes Q<5>, Q<6>, Q<7>, and Q<8> simultaneously to pull up the level of the pull-up nodes Q<5>, Q<6>, Q<7>, and Q<8> to a high level.

It should be noted that in the sixth phase, only the transmission circuit connected to the seventh-stage input-output unit may be turned on, so that only the level of the pull-up node Q<7> is pulled up to a high level.

In a seventh stage P7, the second clock signal terminal CLKB (connected to the third sub-clock signal line CLK_3) in the seventh-stage input-output unit is input with a high-level signal. The level of the pull-up node Q<7> is further pulled up due to the bootstrap effect, the fifth transistor M5 and the sixth transistor M6 in the seventh-stage input-output unit are turned on, and the high-level signal input from the second clock signal terminal CLKB in the seventh-stage input-output unit can be output to the shift signal output terminal CR<7> and the pixel scanning signal output terminal OUT<7>. For example, the signal output from the pixel scanning signal output terminal OUT<7> can be used to drive sensing transistors in the sub-pixel units in the display panel to achieve the external compensation. In addition, the signal input from the third clock signal terminal CLKC can be output to the pixel scanning signal output terminal OUT2<7>. As illustrated in FIG. 15, the signal of OUT2<7> can be different from the signal of OUT<7>, thereby improving the driving capability of the gate driving circuit to meet diverse requirements.

In an eighth phase P8, the level of the signal input from the second clock signal terminal CLKB (connected to the third sub-clock signal line CLK_3) in the seventh-stage input-output unit changes from a high level to a low level, and the level of pull-up node Q<7> is pulled down due to the bootstrap effect.

In a ninth phase P9, the fifth sub-clock signal line CLK_5 and the sixth sub-clock signal line CLK_6 provide a high-level signal. Because the compensation selection control terminal OE of each blanking unit 100 is connected to the fifth sub-clock signal line CLK_5, and the total reset signal terminal TRST of each input-output unit is connected to the sixth sub-clock signal line CLK_6, thereby resetting the level of the pull-up control node H in each blanking unit 100 and the level of the pull-up node Q in each input-output unit.

Here, the driving timing of the first frame ends. The driving process of the gate driving circuit in the subsequent phases such as in a second frame, a third frame, and the like can be with reference to the above description, and details are not described herein again.

It should be noted that, in the above description of the working principle of the random compensation, the driving signal corresponding to the seventh row of the sub-pixel units of the display panel is output as an example during the blanking phase of the first frame, and the present disclosure are not limited thereto. For example, in a case where a driving signal corresponding to an (n)th row of sub-pixel units of the display panel is required to be output during a blanking phase of a certain frame, it is necessary to pull up the level of the pull-up node Q in an (n)th-stage input-output unit in the blanking phase of the frame, and in in the blanking phase of the frame, a high-level signal is input through the second clock signal terminal CLKB or the third clock signal terminal CLKC in the (n)th-stage input-output unit, and n is an integer greater than zero.

In addition, in the embodiment of the present disclosure, the same timing of the two signals refers to time synchronization at a high level, and the amplitudes of the two signals are not required to be the same.

Figure 16:
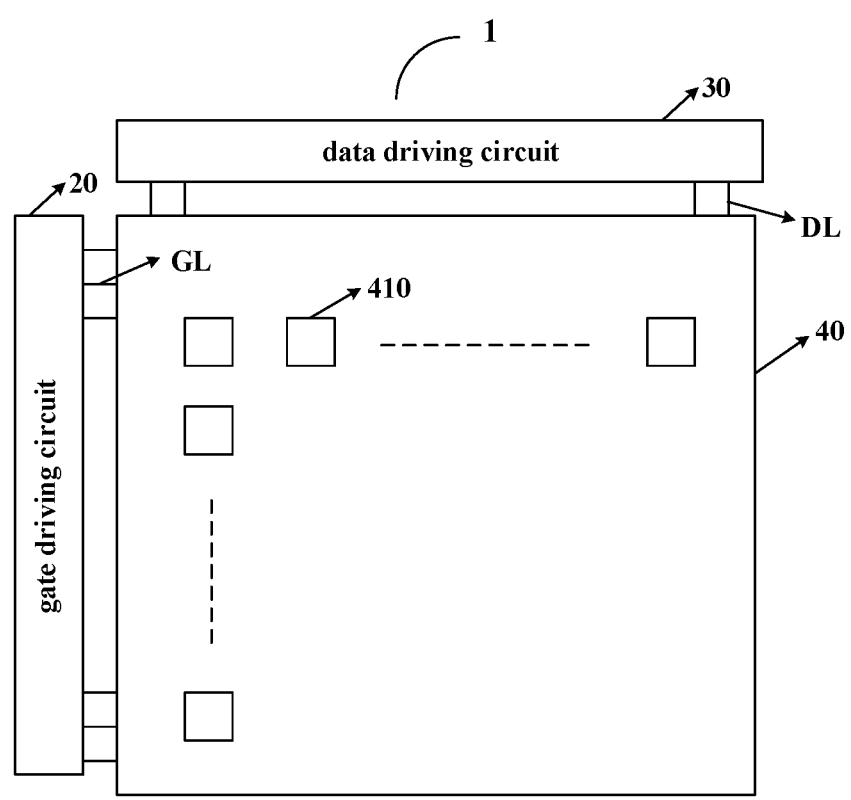
FIG. 16 is a schematic diagram of a display device provided by some embodiments of the present disclosure.

At least one embodiment of the present disclosure further provides a display device 1. As illustrated in FIG. 16, the display device 1 includes the gate driving circuit 20 and a plurality of sub-pixel units 410 arranged in an array. For example, the display device 1 further includes a display panel 40, and a pixel array composed of a plurality of sub-pixel units 410 is disposed in the display panel 40.

The first output terminal OP1 and the second output terminal OP2 in each of the shift register units 10 in the gate driving circuit 20 are respectively electrically connected to different rows of the sub-pixel units 410. For example, the gate driving circuit 20 is electrically connected to the sub-pixel units 410 through gate lines GL. The gate driving circuit 20 is used to provide a driving signal to the pixel array, for example, the driving signal can drive the scanning transistor and the sensing transistor in the sub-pixel unit 410.

For example, the display device 1 may further include a data driving circuit 30 for providing a data signal to the pixel array. For example, the data driving circuit 30 is electrically connected to the sub-pixel units 410 through a data line DL.

It should be noted that the display device 1 in the present embodiments may be: a liquid crystal panel, a liquid crystal television, a display screen, an OLED panel, an OLED television, an electronic paper display device, a mobile phone, a tablet computer, a notebook computer, a digital photo frame, a navigator, or any product or component with the display function.

The technical effects of the display device 1 provided by the embodiments of the present disclosure can be with reference to the corresponding description of the gate driving circuit 20 in the above embodiments, and details are not described herein again.

Figure 17:
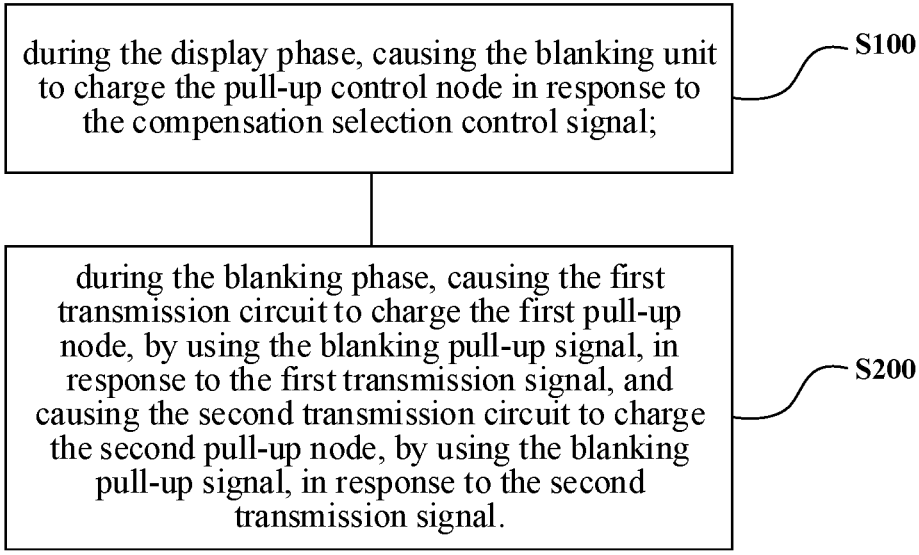
FIG. 17 is a schematic diagram of a driving method of the shift register unit provided by some embodiments of the present disclosure.

At least one embodiment of the present disclosure further provides a driving method that can be used to drive the shift register unit 10 provided by the embodiment of the present disclosure, a plurality of the shift register units 10 can be cascaded to create the gate driving circuit provided by an embodiment of the present disclosure, and the gate driving circuit is used to drive the display panel to display at least one frame. The driving method includes a display phase for one frame and a blanking phase for the frame. As illustrated in FIG. 17, the driving method includes the following steps.

Step S100: during the display phase, causing the blanking unit to charge the pull-up control node in response to the compensation selection control signal.

Step S200: during the blanking phase, causing the first transmission circuit to charge the first pull-up node in response to the first transmission signal, and causing the second transmission circuit to charge the second pull-up node in response to the second transmission signal.

In the driving methods provided by other embodiments, the timing of the first transmission signal and the timing of the second transmission signal are the same.

It should be noted that the detailed description and technical effects of the driving method provided by the embodiments of the present disclosure may be with reference to the description of the working principle of the shift register unit 10 and the gate driving circuit 20 in the embodiments of the present disclosure, and details are not described herein again.

What have been described above are only specific implementations of the present disclosure, the protection scope of the present disclosure is not limited thereto, and the protection scope of the present disclosure should be based on the protection scope of the claims.

What is claimed is:

1. A shift register unit, comprising a first transmission circuit and a first input-output unit,
   wherein the first input-output unit comprises a first pull-up node and a first output terminal,
   the first transmission circuit is electrically connected to a blanking pull-up node and the first pull-up node, and is configured to charge the first pull-up node, by using a blanking pull-up signal, in response to a first transmission signal,
   the first input-output unit comprises an output circuit, a first pull-down control circuit, and a first pull-down auxiliary control circuit,
   the output circuit is configured to output a composite output signal to the first output terminal under control of a level of the first pull-up node,
   the first pull-down control circuit is configured to control a level of a pull-down node under the control of the level of the first pull-up node, and
   the first pull-down auxiliary control circuit is configured to control the first pull-down control circuit so as to further control a level of the pull-down node under the control of the level of the first pull-up node.

2. The shift register unit according to claim 1, further comprising a blanking unit, wherein the blanking unit is configured to charge a pull-up control node in response to a compensation selection control signal and input the blanking pull-up signal to the blanking pull-up node,
   wherein the blanking unit comprises a blanking input circuit and a blanking pull-up circuit,
   the blanking input circuit is configured to charge the pull-up control node in response to the compensation selection control signal, and to maintain a level of the pull-up control node, and
   the blanking pull-up circuit is configured to input the blanking pull-up signal to the blanking pull-up node under control of the level of the pull-up control node.

3. The shift register unit according to claim 2, wherein the blanking unit further comprises a blanking coupling circuit,
   the blanking coupling circuit is electrically connected to the pull-up control node, and is configured to pull-up, by coupling, the level of the pull-up control node.

4. The shift register unit according to claim 2, wherein the blanking input circuit comprises a first transistor and a first capacitor,
   a gate electrode of the first transistor is connected to a compensation selection control terminal to receive the compensation selection control signal, a first electrode of the first transistor is connected to a blanking input signal terminal, and a second electrode of the first transistor is connected to the pull-up control node, and
   a first electrode of the first capacitor is connected to the pull-up control node, and a second electrode of the first capacitor is connected to a first voltage terminal.

5. The shift register unit according to claim 2, wherein the blanking pull-up circuit comprises a second transistor,
   a gate electrode of the second transistor is connected to the pull-up control node, a first electrode of the second transistor is connected to a second voltage terminal to receive a second voltage, and a second electrode of the second transistor is connected to the blanking pull-up node.

6. The shift register unit according to claim 1, further comprising a common transmission circuit and a second transmission circuit,
   wherein the common transmission circuit is electrically connected to the blanking pull-up node,
   the first transmission circuit is electrically connected to the blanking pull-up node further through the common transmission circuit, and
   the second transmission circuit is electrically connected to the blanking pull-up node further through the common transmission circuit.

7. The shift register unit according to claim 1, wherein the first transmission circuit comprises a first transmission transistor,
   a gate electrode of the first transmission transistor is connected to a first transmission signal terminal to receive the first transmission signal, a first electrode of the first transmission transistor is electrically connected to the blanking pull-up node, and a second electrode of the first transmission transistor is connected to the first pull-up node.

8. The shift register unit according to claim 1, further comprising a second transmission circuit, wherein the second transmission circuit comprises a second transmission transistor,
   a gate electrode of the second transmission transistor is connected to a second transmission signal terminal to receive a second transmission signal, a first electrode of the second transmission transistor is electrically connected to the blanking pull-up node, and a second electrode of the second transmission transistor is connected to a second pull-up node.

9. The shift register unit according to claim 8, wherein the second transmission signal terminal comprises a first clock signal terminal, and the second transmission signal comprises a first clock signal received by the first clock signal terminal.

10. The shift register unit according to claim 1, wherein the first input-output unit further comprises a display input circuit and a pull-down circuit,
    the first output terminal comprises a shift signal output terminal and a pixel scanning signal output terminal, and the shift signal output terminal and the pixel scanning signal output terminal output the composite output signal,
    the display input circuit is configured to charge the first pull-up node in response to a first display input signal, and
    the pull-down circuit is configured to pull down and reset the first pull-up node, the shift signal output terminal, and the pixel scanning signal output terminal under control of the level of the pull-down node.

11. The shift register unit according to claim 10,
    wherein the display input circuit comprises a fourth transistor, a gate electrode of the fourth transistor is connected to a display input signal terminal to receive the first display input signal, a first electrode of the fourth transistor is connected to a second voltage terminal to receive a second voltage, and a second electrode of the fourth transistor is connected to the first pull-up node;
    the output circuit comprises a fifth transistor and a sixth transistor, a gate electrode of the fifth transistor is connected to the first pull-up node, a first electrode of the fifth transistor is connected to a second clock signal terminal to receive a second clock signal and the second clock signal is used as the composite output signal, and a second electrode of the fifth transistor is connected to the shift signal output terminal;

a gate electrode of the sixth transistor is connected to the first pull-up node, a first electrode of the sixth transistor is connected to the second clock signal terminal to receive the second clock signal and the second clock signal is used as the composite output signal, and a second electrode of the sixth transistor is connected to the pixel scanning signal output terminal;

the first pull-down control circuit comprises a seventh transistor and a ninth transistor, a gate electrode of the seventh transistor is connected to a first electrode of the seventh transistor and is further configured to be connected to a third voltage terminal to receive a third voltage, and a second electrode of the seventh transistor is connected to the pull-down node;

a gate electrode of the ninth transistor is connected to the first pull-up node, a first electrode of the ninth transistor is connected to the pull-down node, and a second electrode of the ninth transistor is connected to a fifth voltage terminal to receive a fifth voltage;

the pull-down circuit comprises a tenth transistor, an eleventh transistor, and a twelfth transistor, a gate electrode of the tenth transistor is connected to the pull-down node, a first electrode of the tenth transistor is connected to the first pull-up node, and a second electrode of the tenth transistor is connected to the fifth voltage terminal to receive the fifth voltage;

a gate electrode of the eleventh transistor is connected to the pull-down node, a first electrode of the eleventh transistor is connected to the shift signal output terminal, and a second electrode of the eleventh transistor is connected to the fifth voltage terminal to receive the fifth voltage; and a gate electrode of the twelfth transistor is connected to the pull-down node, a first electrode of the twelfth transistor is connected to the pixel scanning signal output terminal, and a second electrode of the twelfth transistor is connected to a sixth voltage terminal to receive a sixth voltage.

12. The shift register unit according to claim 11, wherein the first pull-down auxiliary control circuit comprises an auxiliary control switching circuit and an auxiliary control transistor, a gate electrode of the auxiliary control switching circuit is configured to be connected with the third voltage terminal to receive the third voltage, and the auxiliary control switching circuit is connected between the third voltage terminal and the gate electrode of the seventh transistor, and a gate electrode of the auxiliary control transistor is connected to the first pull-up node, a first electrode of the auxiliary control transistor is connected to the gate electrode of the seventh transistor and is connected with the auxiliary control switching circuit, and a second electrode of the auxiliary control transistor is connected to the fifth voltage terminal to receive the fifth voltage.

13. The shift register unit according to claim 11, wherein the output circuit further comprises a second capacitor, wherein a second electrode of the second capacitor is connected to the second electrode of the fifth transistor or the second electrode of the sixth transistor.

14. The shift register unit according to claim 11, wherein the first input-output unit further comprises a second pull-down control circuit and a third pull-down control circuit, the second pull-down control circuit is configured to control the level of the pull-down node in response to a first clock signal, and the third pull-down control circuit is configured to control the level of the pull-down node in response to the first display input signal.

15. The shift register unit according to claim 14, wherein the second pull-down control circuit comprises a thirteenth transistor, and the third pull-down control circuit comprises a fourteenth transistor, a gate electrode of the thirteenth transistor is connected to a first clock signal terminal to receive the first clock signal, a first electrode of the thirteenth transistor is connected to the pull-down node, and a second electrode of the thirteenth transistor is connected to a fifth voltage terminal to receive a fifth voltage, and a gate electrode of the fourteenth transistor is connected to the display input signal terminal to receive the first display input signal, a first electrode of the fourteenth transistor is connected to the pull-down node, and a second electrode of the fourteenth transistor is connected to the fifth voltage terminal to receive the fifth voltage.

16. The shift register unit according to claim 14, wherein the second pull-down control circuit comprises a thirteenth transistor and a seventeenth transistor, and the third pull-down control circuit comprises a fourteenth transistor;

a gate electrode of the thirteenth transistor is connected to a first clock signal terminal to receive the first clock signal, a first electrode of the thirteenth transistor is connected to the pull-down node, and a second electrode of the thirteenth transistor is connected to a first electrode of the seventeenth transistor;

a gate electrode of the seventeenth transistor is electrically connected to a pull-up control node, and a second electrode of the seventeenth transistor is connected to a fifth voltage terminal to receive a fifth voltage; and a gate electrode of the fourteenth transistor is connected to the display input signal terminal to receive the first display input signal, a first electrode of the fourteenth transistor is connected to the pull-down node, and a second electrode of the fourteenth transistor is connected to the fifth voltage terminal to receive the fifth voltage.

17. The shift register unit according to claim 11, wherein the first input-output unit further comprises a display reset circuit and a total reset circuit, the display reset circuit is configured to reset the first pull-up node in response to a display reset signal, and the total reset circuit is configured to reset the first pull-up node in response to a total reset signal.

18. The shift register unit according to claim 17, wherein the display reset circuit comprises a fifteenth transistor, and the total reset circuit comprises a sixteenth transistor;

a gate electrode of the fifteenth transistor is connected to a display reset signal terminal to receive the display reset signal, a first electrode of the fifteenth transistor is connected to the first pull-up node, and a second electrode of the fifteenth transistor is connected to a fifth voltage terminal to receive a fifth voltage; and a gate electrode of the sixteenth transistor is connected to a total reset signal terminal to receive the total reset signal, a first electrode of the sixteenth transistor is connected to the first pull-up node, and a second electrode of the sixteenth transistor is connected to the fifth voltage terminal to receive the fifth voltage.

19. The shift register unit according to claim 11, further comprising a second input-output unit, wherein a circuit structure of the second input-output unit is the same as a circuit structure of the first input-output unit.

20. A display device, comprising a gate driving circuit, and a plurality of sub-pixel units arranged in an array,
wherein the gate driving circuit comprises a plurality of cascaded shift register units, each of the plurality of cascaded shift register units comprises a first transmission circuit, and a first input-output unit,
the first input-output unit comprises a first pull-up node and a first output terminal;
the first transmission circuit is electrically connected to a blanking pull-up node and the first pull-up node;
the first input-output unit comprises an output circuit, a first pull-down control circuit, and a first pull-down auxiliary control circuit, wherein the output circuit is configured to output a composite output signal to the first output terminal under control of a level of the first pull-up node, the first pull-down control circuit is configured to control a level of a pull-down node under the control of the level of the first pull-up node, the first pull-down auxiliary control circuit is configured to control the first pull-down control circuit so as to further control a level of the pull-down node under the control of the level of the first pull-up node; and
the first output terminal of each shift register unit in the gate driving circuit are electrically connected to sub-pixel units in a row.

* * * * *